United States Patent
Kaneko et al.

(10) Patent No.: US 8,921,025 B2
(45) Date of Patent: Dec. 30, 2014

(54) POSITIVE RESIST COMPOSITIONS AND PATTERNING PROCESS

(75) Inventors: Tatsushi Kaneko, Joetsu (JP); Koji Hasegawa, Joetsu (JP); Tsunehiro Nishi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 603 days.

(21) Appl. No.: 12/793,284

(22) Filed: Jun. 3, 2010

(65) Prior Publication Data

US 2010/0310986 A1   Dec. 9, 2010

(30) Foreign Application Priority Data

Jun. 4, 2009   (JP) .................. 2009-135113

(51) Int. Cl.
| | | |
|---|---|---|
| G03F 7/00 | (2006.01) | |
| G03F 7/20 | (2006.01) | |
| G03F 7/039 | (2006.01) | |
| G03F 7/004 | (2006.01) | |

(52) U.S. Cl.
CPC ............ *G03F 7/0397* (2013.01); *G03F 7/0046* (2013.01); *G03F 7/2041* (2013.01); *G03F 7/0045* (2013.01)
USPC ........................................ 430/270.1; 430/322

(58) Field of Classification Search
USPC ............................ 430/270.1, 273.1, 325, 326
See application file for complete search history.

(56) References Cited

U.S. PATENT DOCUMENTS

| | | | |
|---|---|---|---|
| 6,329,125 B2 | 12/2001 | Takechi et al. | |
| 7,618,764 B2 | 11/2009 | Tanaka et al. | |
| 7,670,751 B2 | 3/2010 | Ohashi et al. | |
| 2008/0026331 A1* | 1/2008 | Hasegawa et al. | 430/327 |
| 2009/0035699 A1* | 2/2009 | Hasegawa et al. | 430/285.1 |
| 2009/0233223 A1* | 9/2009 | Tachibana et al. | 430/270.1 |
| 2009/0274984 A1* | 11/2009 | Shinachi et al. | 430/325 |
| 2010/0304295 A1* | 12/2010 | Kinsho et al. | 430/270.1 |

FOREIGN PATENT DOCUMENTS

| | | | |
|---|---|---|---|
| JP | 9-73173 A | | 3/1997 |
| JP | 9-90637 A | | 4/1997 |
| JP | 2001188346 A | * | 7/2001 |
| JP | 2008-31298 A | | 2/2008 |
| JP | 2009-080474 A | | 4/2009 |
| JP | 2010053163 A | * | 3/2010 |
| TW | 200900861 A | | 1/2009 |

OTHER PUBLICATIONS

Machine translation JP 2010-053163. Mar. 11, 2010.*
Machine translation JP 2001-188346. Jul. 10, 2001.*
Koji Arimitsu et al., "Effect of Phenolic Hydroxyl Residues on the Improvement of Acid-Proliferation-Type Photoimaging Materials", Journal of Photopolymer Science and Technology, vol. 9, No. 1, 1996, pp. 29-30.
Koji Arimitsu et al., "Sensitivity Enhancement of Chemical-Amplification-Type Photoimaging Materials by Acetoacetic Acid Derivatives", Journal of Photopolymer Science and Technology, vol. 8, No. 1, 1995, pp. 43-44.
Taiwanese Office Action dated Mar. 8, 2013 for TW Application No. 099117764.

* cited by examiner

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A positive resist composition comprises (A) a resin component which becomes soluble in an alkaline developer under the action of an acid and (B) an acid generator. Resin component (A) is a polymer comprising recurring units of formula (1) wherein $R^1$ is H, $CH_3$ or $CF_3$, $R^2$ is an acid labile group, $R^3$ is H or $CO_2CH_3$, X is O, S, $CH_2$ or $CH_2CH_2$, $0.01 \leq a < 1$ and $0.01 \leq b < 1$. When processed by ArF lithography, the composition forms a pattern with a satisfactory mask fidelity and a minimal LWR.

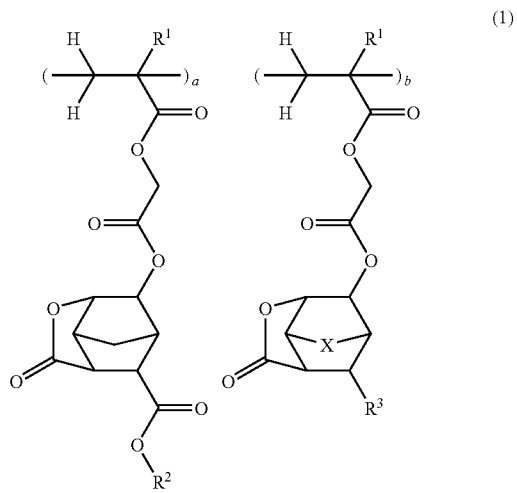

4 Claims, No Drawings

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application No. 2009-135113 filed in Japan on Jun. 4, 2009, the entire contents of which are hereby incorporated by reference.

TECHNICAL FIELD

This invention relates to a positive resist composition suited for use in the micropatterning technology for forming a pattern with improved mask fidelity and a minimal line width roughness, and a patterning process using the same.

BACKGROUND ART

In the recent drive for higher integration and operating speeds in LSI devices, it is desired to miniaturize the pattern rule. Great efforts have been devoted for the development of the micropatterning technology using deep-ultraviolet (deep-UV) or vacuum-ultraviolet (VUV) lithography. The photolithography using KrF excimer laser (wavelength 248 nm) as the light source has already established the main role in the commercial manufacture of semiconductor devices. The photolithography using ArF excimer laser (wavelength 193 nm) is also used in the commercial semiconductor manufacture. With respect to the ArF excimer laser lithography, efforts are also made to develop the immersion lithography process that intends to gain a stretch of resolution by interposing a high refractive index liquid between a resist coating film and a projection lens. Using an ArF immersion lithography tool with a projection lens having a numerical aperture (NA) in excess of 1.0, a resist is processed to form a pattern at a pitch which is less than the wavelength. There is a need for a resist material meeting such micropatterning.

The requisite properties for the resist materials complying with the ArF excimer laser lithography include transparency at wavelength 193 nm and dry etch resistance. Resist materials comprising as a base resin poly(meth)acrylic acid derivatives having bulky acid-labile protective groups as typified by 2-ethyl-2-adamantyl and 2-methyl-2-adamantyl groups were proposed as having both the properties (JP-A 9-73173 and JP-A 9-90637). Since then, a variety of materials have been proposed. Most of them commonly use resins having a highly transparent backbone and a carboxylic acid moiety protected with a bulky tertiary alkyl group.

While prior art resist materials adapted to the ArF lithography suffer from many problems, the most serious problem is the unevenness of fine line size, which is generally referred to as "line width roughness" (LWR). Since the LWR has a substantial impact on the performance of semiconductor devices being fabricated, it is strongly desired to overcome this problem. If it is merely required to form a pattern having side walls with a smooth finish, that purpose may be attained to a more or less extent by selecting a resin with a lower molecular weight and/or a photoacid generator which generates a more mobile acid. With this approach, however, such properties as exposure dose dependency, pattern density dependency, and mask error enhancement factor (MEEF) are extremely exacerbated. Particularly when a resist material has poor MEEF, even a minute variation or fluctuation of line width on a mask can be transferred to a resist pattern in an amplified manner. Thus the line size itself becomes rather uneven. This approach does not lead to a reduction of LWR. Under the continuing demand for a further reduction of the pattern rule, the resist is required to attain good performance with respect to sensitivity, substrate adhesion and etch resistance and additionally, to find an essential solution to improve LWR without concomitant sacrifice of MEEF.

CITATION LIST

Patent Document 1: JP-A H09-73173
Patent Document 2: JP-A H09-90637
Patent Document 3: JP-A 2008-31298 (US 2008026331)

DISCLOSURE OF THE INVENTION

An object of the invention is to provide a positive resist composition which meets both the advantages of minimal LWR and improved MEEF when processed by the photolithography using high-energy radiation such as ArF excimer laser light as a light source, and a patterning process using the same.

The inventors have found that a positive resist composition comprising a polymer comprising recurring units of the following formula (1) as a base resin can form a pattern having excellent MEEF and reduced LWR when processed by the photolithography. The composition is thus quite effective for precise micropatterning.

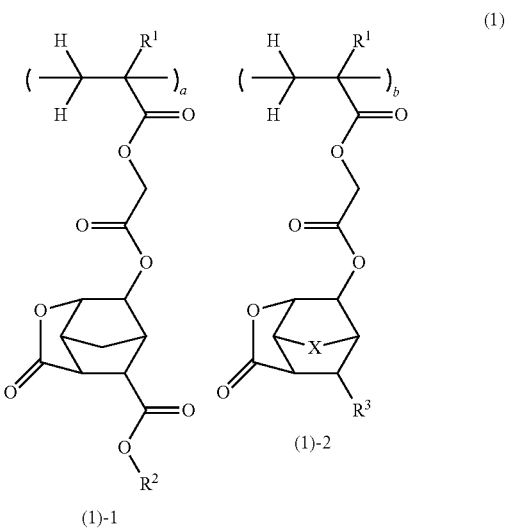

Herein $R^1$ is each independently hydrogen, methyl or trifluoromethyl, $R^2$ is an acid labile group, $R^3$ is hydrogen or $CO_2CH_3$, X is O, S, $CH_2$ or $CH_2CH_2$, a and b indicative of ratios of the respective units incorporated are each a number from 0.01 to less than 1.

Notably Patent Document 3 discloses a resist composition comprising a polymer comprising recurring units of the formula shown below as a base resin.

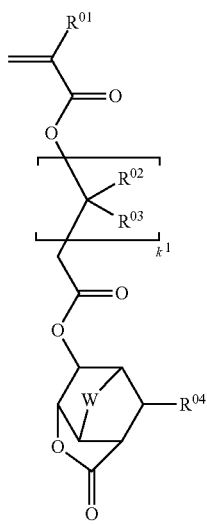

Herein $R^{01}$ is hydrogen, fluorine, methyl or trifluoromethyl, $R^{02}$ and $R^{03}$ are each independently a straight, branched or cyclic monovalent hydrocarbon group of 1 to 10 carbon atoms, or $R^{02}$ and $R^{03}$ may bond together to form an aliphatic hydrocarbon ring with the carbon atom to which they are attached, $R^{04}$ is hydrogen or $CO_2R^{05}$, $R^{05}$ is a straight, branched or cyclic monovalent hydrocarbon group of 1 to 15 carbon atoms which may have a halogen or oxygen atom, W is $CH_2$, O or S, with the proviso that $R^{04}$ is $CO_2R^{05}$ when W is $CH_2$, and $R^{04}$ is hydrogen or $CO_2R^{05}$ when W is O or S, and $k^1$ is 0 or 1.

Therefore, the recurring units (1)-1 and (1)-2 in formula (1) are described in Patent Document 3. However, the combined use of units (1)-1 and units (1)-2 and the resultant effect are described nowhere in Patent Document 3. The inventors have found that as will be later demonstrated in Examples and Comparative Examples, a positive resist composition comprising a polymer comprising units (1)-1 alone or a polymer comprising units (1)-2 alone as the base resin exhibits a noticeable MEEF and/or a noticeable LWR, whereas a positive resist composition comprising a polymer comprising units (1)-1 and units (1)-2 combined exhibits inherently reduced MEEF and LWR, that is, selective effects of excellent MEEF and minimized LWR.

One embodiment of the invention is a positive resist composition comprising (A) a resin component which becomes soluble in an alkaline developer under the action of an acid and (B) a compound capable of generating an acid in response to actinic light or radiation, wherein resin component (A) is a polymer comprising recurring units represented by the general formula (1):

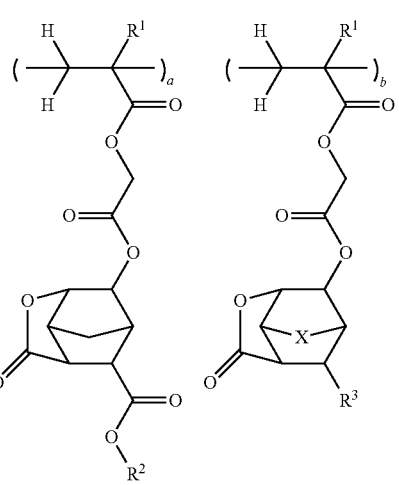

wherein $R^1$ is each independently hydrogen, methyl or trifluoromethyl, $R^2$ is an acid labile group, $R^3$ is hydrogen or $CO_2CH_3$, X is O, S, $CH_2$ or $CH_2CH_2$, a and b indicative of ratios of the respective units incorporated are each a number from 0.01 to less than 1.

In a preferred embodiment, resin component (A) is a polymer comprising recurring units represented by the general formula (2):

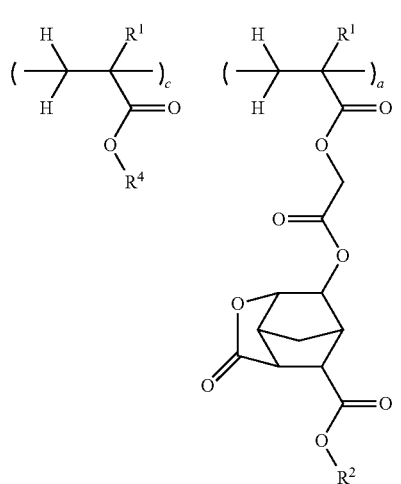

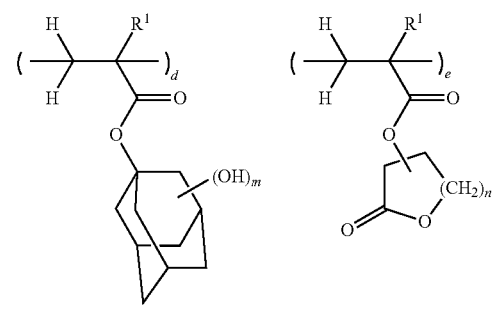

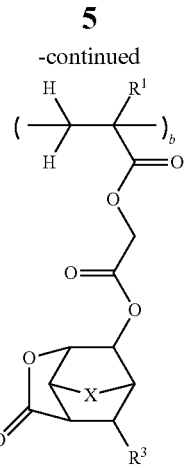

wherein $R^1$ is each independently hydrogen, methyl or trifluoromethyl, $R^2$ and $R^4$ each are an acid labile group, $R^3$ is hydrogen or $CO_2CH_3$, X is O, S, $CH_2$ or $CH_2CH_2$, m is 1 or 2, n is 1 or 2, a, b, c, d and e are indicative of ratios of the respective units incorporated, a and b each are a number from 0.01 to less than 1, c, d and e each are a number from 0 to less than 1, and a+b+c+d+e=1.

In a preferred embodiment, compound (B) is at least one sulfonium salt compound having the general formula (3):

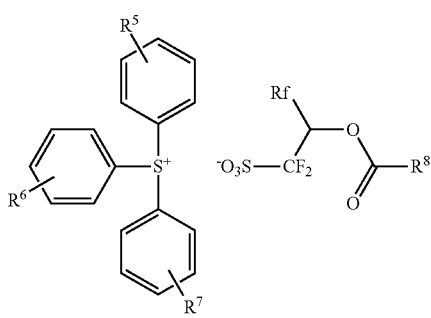

wherein $R^5$, $R^6$ and $R^7$ are each independently hydrogen or a straight, branched or cyclic, monovalent hydrocarbon group of 1 to 20 carbon atoms which may contain a heteroatom, $R^8$ is a straight, branched or cyclic, monovalent hydrocarbon group of 7 to 30 carbon atoms which may contain a heteroatom, and Rf is hydrogen or trifluoromethyl.

In a preferred embodiment, the acid labile group in resin component (A) is one or more group selected from groups having the following formulae (a-1) to (a-5):

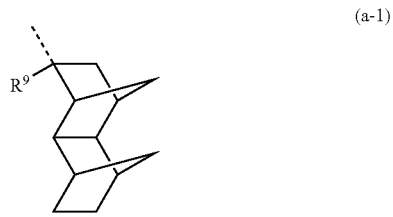

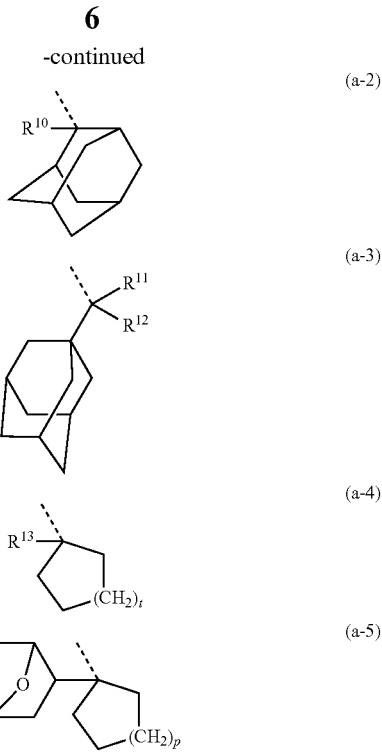

wherein the broken line denotes a valence bond, $R^9$, $R^{10}$, $R^{11}$, $R^{12}$ and $R^{13}$ are each independently a straight or branched alkyl group of 1 to 4 carbon atoms, t is 1 or 2, and p is 1 or 2.

Another embodiment of the invention is a process for forming a pattern, comprising the steps of applying the positive resist composition defined above onto a substrate to form a resist coating, baking, exposing the resist coating to high-energy radiation or electron beam through a mask, PEB, and developing the exposed coating with a developer. In a preferred embodiment, the exposing step may be effected by the immersion lithography wherein a fluid comprising deionized water or an organic compound intervenes between the resist coating and a projection lens. In another preferred embodiment, the process may further comprise the step of applying a protective coating on the resist coating, and the exposing step may be effected by the immersion lithography wherein a fluid comprising deionized water or an organic compound intervenes between the protective coating and a projection lens.

Advantageous Effects of Invention

When processed by the micropatterning process, especially ArF lithography, the positive resist composition of the invention forms a pattern with a good mask fidelity and a minimized LWR. The composition is thus quite effective for precise micropatterning.

PREFERRED EMBODIMENTS OF THE INVENTION

Below the resist composition of the invention is described in detail. The singular forms "a," "an" and "the" include plural referents unless the context clearly dictates otherwise. The notation (Cn-Cm) means a group containing from n to m carbon atoms per group. As used herein, the term "film" is used interchangeably with "coating" or "layer."

The abbreviations and acronyms have the following meaning.

LWR: line width roughness
MEEF: mask error enhancement factor
Mw: weight average molecular weight
GPC: gel permeation chromatography
PEB: post-exposure baking It is understood that for some structures represented by chemical formulae, there can exist enantiomers and diastereomers because of the presence of asymmetric carbon atoms. In such a case, a single formula collectively represents all such isomers. The isomers may be used alone or in admixture.

Component A

The positive resist composition of the invention comprises (A) a resin component which becomes soluble in an alkaline developer under the action of an acid and (B) a compound capable of generating an acid in response to actinic light or radiation, wherein resin component (A) is a polymer comprising recurring units represented by the general formula (1).

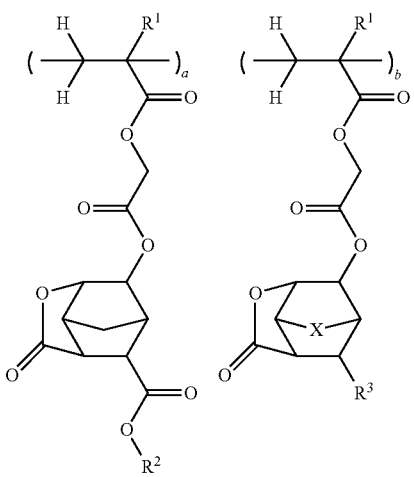
(1)

Herein $R^1$ is each independently hydrogen, methyl or trifluoromethyl. $R^2$ is an acid labile group. $R^3$ is hydrogen or $CO_2CH_3$. X is O, S, $CH_2$ or $CH_2CH_2$. The subscripts a and b, indicative of ratios of the respective units incorporated, are each a number from 0.01 to less than 1.

In formula (1), the lactone units incorporated in ratio "b" have a high affinity to alkaline developer and are moderately dissolved in the developer. They are effective for inhibiting formation of a swollen layer and reducing LWR. However, the lactone units have a low acid diffusion control ability and allow the acid to diffuse during PEB, leading to the drawback that properties such as exposure dose dependency, pattern density dependency (or proximity bias), and MEEF are exacerbated. If the lactone units are incorporated in an excess ratio "b" in the polymer or resin component (A), side walls of a pattern as developed become non-uniform in size because of poor MEEF despite inhibited formation of a swollen layer.

Making efforts to solve this problem, the inventors have found that a positive resist composition comprising a polymer comprising recurring units represented by formula (1) as resin component (A) is excellent in both LWR and MEEF.

Specifically, the resist composition of the invention is characterized by the use as a resin component of a polymer comprising both acid labile group-protected lactone units incorporated in ratio "a" and lactone units incorporated in ratio "b" as represented by formula (1).

The units incorporated in ratio "a" as such are not effective in allowing the acid to diffuse during PEB because their solubility in alkaline developer is inhibited by acid labile groups. Under the action of an acid generated upon exposure, the acid labile groups are eliminated whereby the protected units turn to lactone units having an alkaline developer solubility. This increases the proportion of lactone units in the resin component in the exposed area, which contributes to a reduction of LWR.

The preferred ranges of incorporation ratios "a" and "b" are:

0.01≤a≤0.5, more preferably 0.05≤a≤0.4, and 0.01≤b≤0.5, more preferably 0.05≤b≤0.4.

If the incorporation ratio "a" or "b" is below the range, the effect of improving LWR of a pattern is not sufficient. If the incorporation ratio "a" or "b" is beyond the range, the acid may diffuse during PEB, exacerbating MEEF and sometimes failing to form a pattern faithful to the mask size.

In a preferred embodiment, resin component (A) is a polymer comprising recurring units represented by the general formula (2).

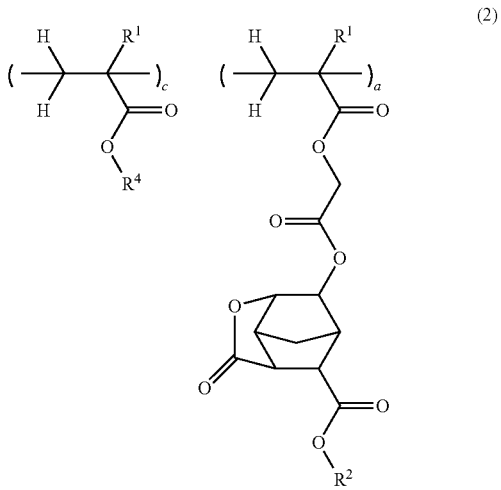
(2)

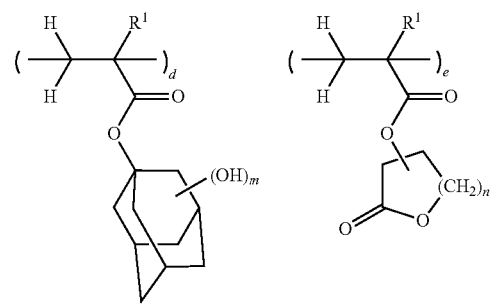

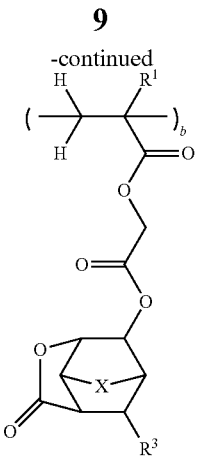

Herein $R^1$ is each independently hydrogen, methyl or trifluoromethyl. $R^2$ and $R^4$ each are an acid labile group. $R^3$ is hydrogen or $CO_2CH_3$. X is O, S, $CH_2$ or $CH_2CH_2$. The subscript m is 1 or 2, and n is 1 or 2. The subscripts a, b, c, d and e are indicative of ratios of the respective units incorporated, a and b each are a number from 0.01 to less than 1, c, d and e each are a number from 0 to less than 1, and a+b+c+d+e=1. The preferred ranges of incorporation ratios a, b, c, d and e are:

$0.01 \leq a \leq 0.5$, more preferably $0.05 \leq a \leq 0.4$, $0.01 \leq b \leq 0.5$, more preferably $0.05 \leq b \leq 0.4$, $0 \leq c \leq 0.5$, more preferably $0 \leq c \leq 0.4$, $0 \leq d \leq 0.5$, more preferably $0.05 \leq d \leq 0.3$, and $0 \leq e \leq 0.5$, more preferably $0.05 \leq e \leq 0.4$.

The meaning of a+b+c+d+e=1 is that in a polymer comprising recurring units (a) to (e), the total of these recurring units (a) to (e) is 100 mol % relative to the total of entire recurring units.

In resin component (A), the acid labile group represented by $R^2$ and $R^4$ is one or more group selected from groups having the following formulae (a-1) to (a-5).

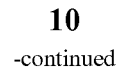

(a-1)

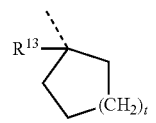

(a-2)

(a-3)

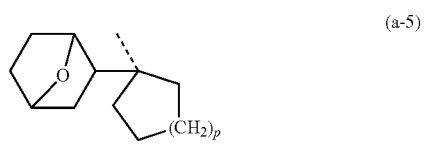

(a-4)

(a-5)

Herein the broken line denotes a valence bond. $R^9$, $R^{10}$, $R^{11}$, $R^{12}$ and $R^{13}$ are each independently a straight or branched alkyl group of 1 to 4 carbon atoms, for example, methyl, ethyl, propyl, isopropyl, n-butyl, sec-butyl, and tert-butyl. The subscript t is 1 or 2, and p is 1 or 2.

Illustrative, non-limiting examples of the acid labile groups represented by $R^2$ and $R^4$ are given below.

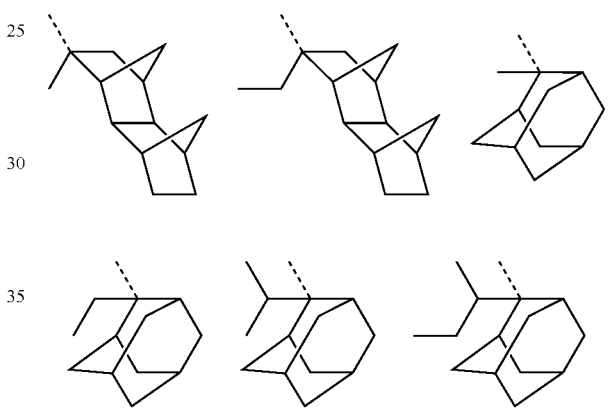

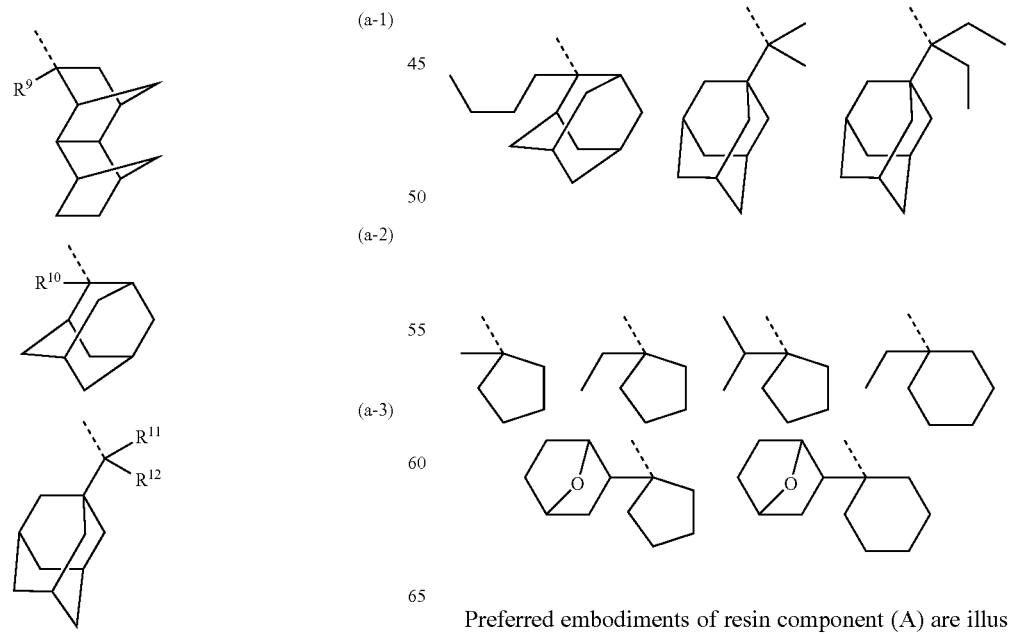

Preferred embodiments of resin component (A) are illustrated below, but not limited thereto.

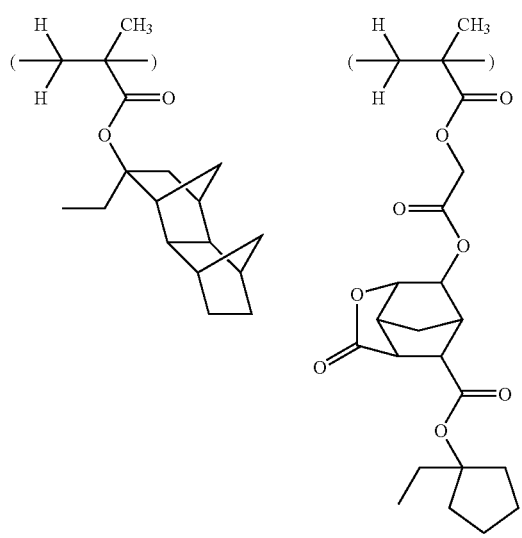
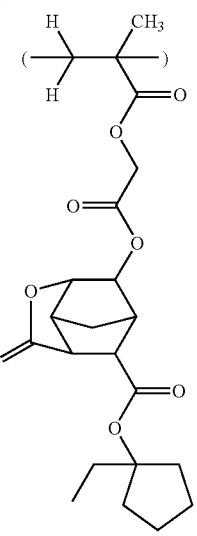
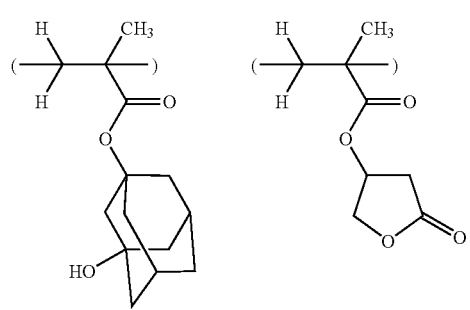
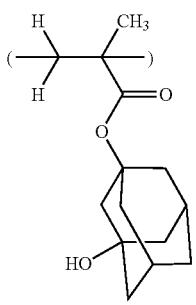
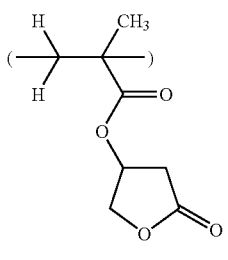
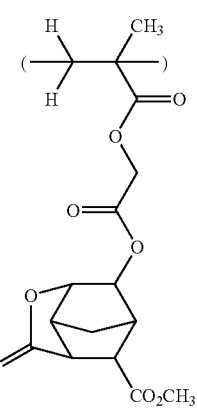
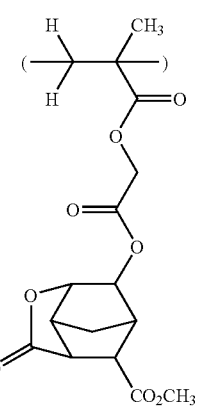

13
-continued
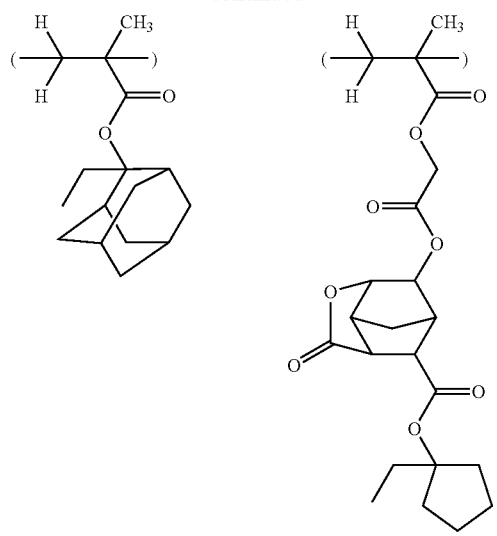
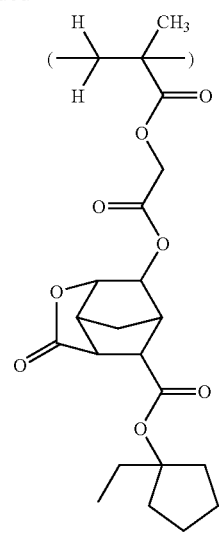 [SMILES: CCC1(OC(=O)C2C3CC4C(OC(=O)C42)C3OC(=O)COC(=O)C(C)(C)CC)CCCC1]
14
-continued
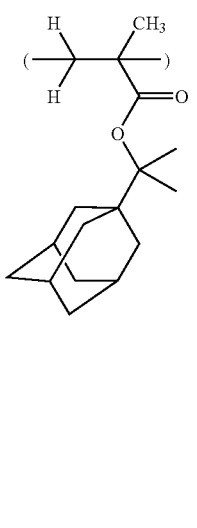
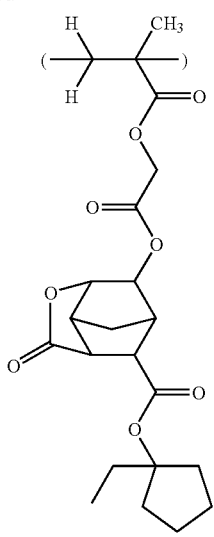
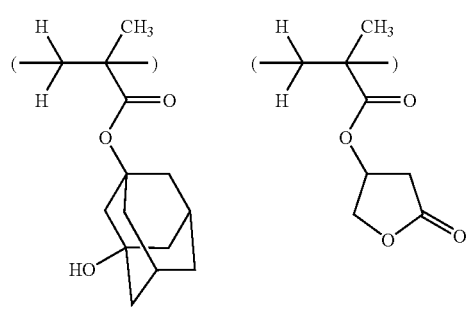
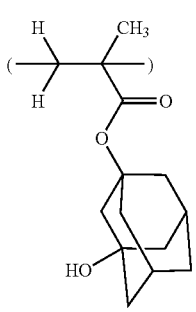
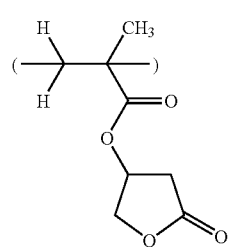
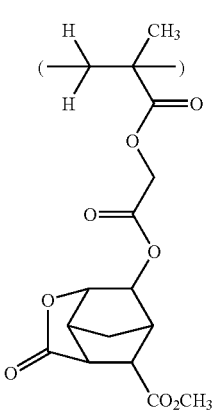
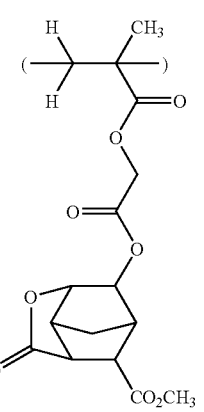

15
-continued
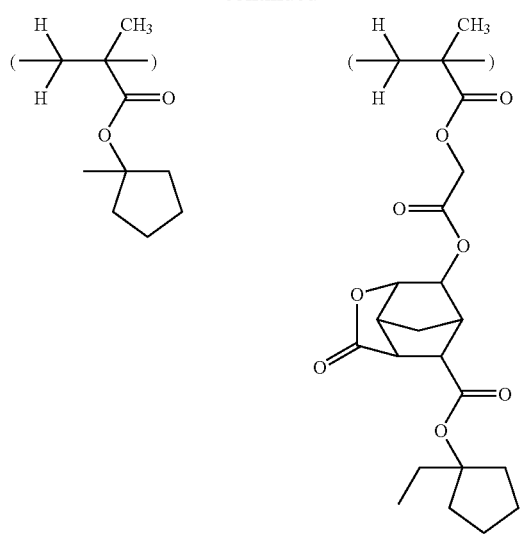
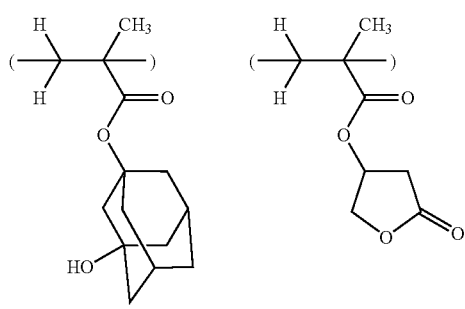
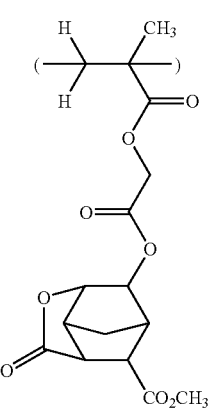 [SMILES: CCC(C)(C)C(=O)OCC(=O)OC1C2OC(=O)C3C2OC1C3C(=O)OC]
16
-continued
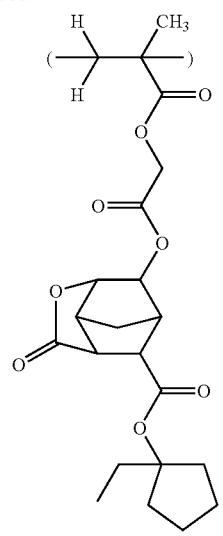
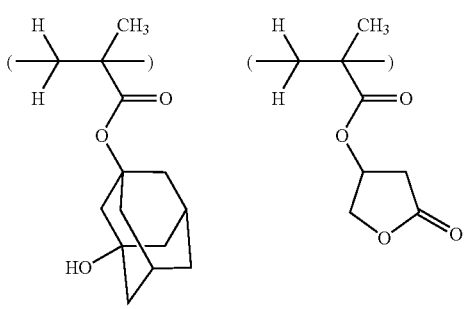
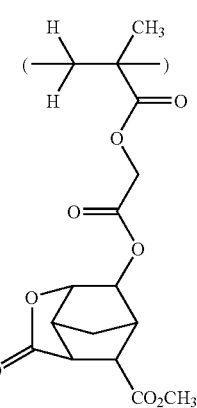

-continued
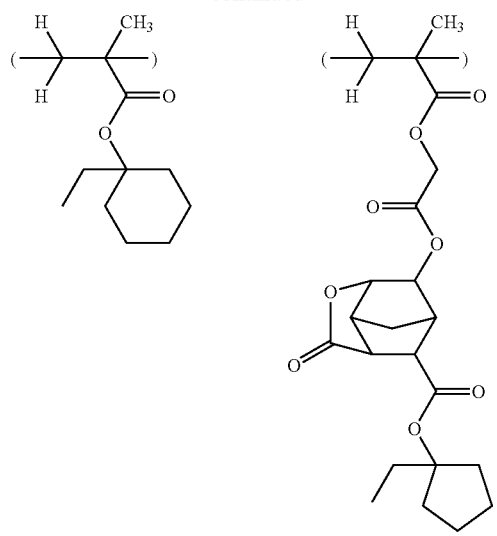
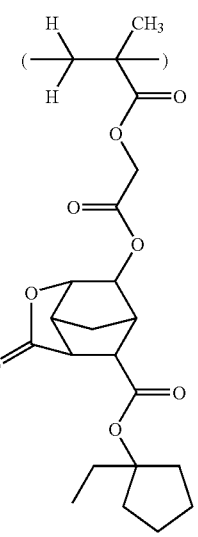
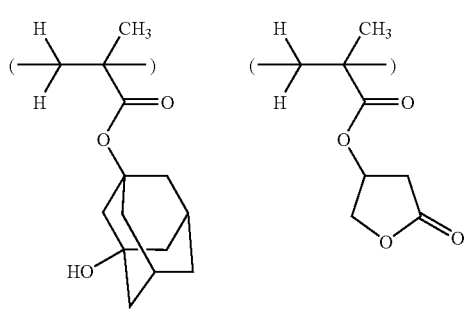
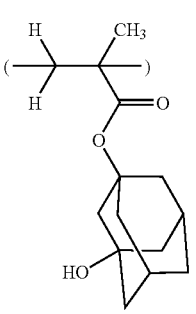
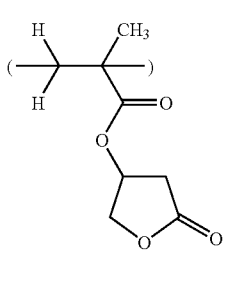
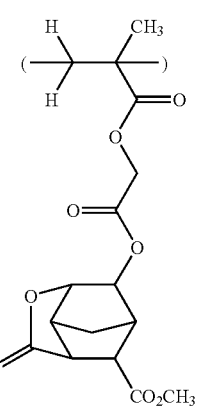
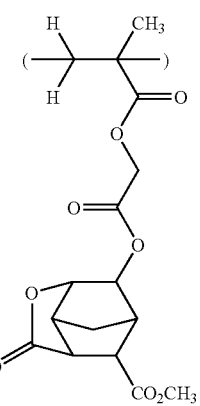

19
-continued
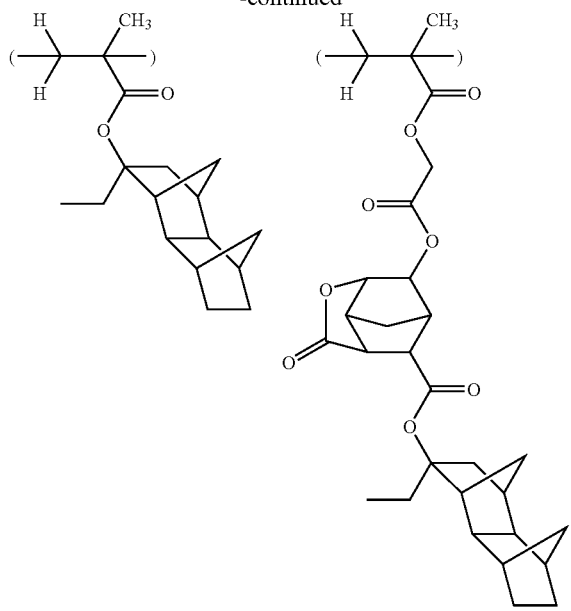
20
-continued
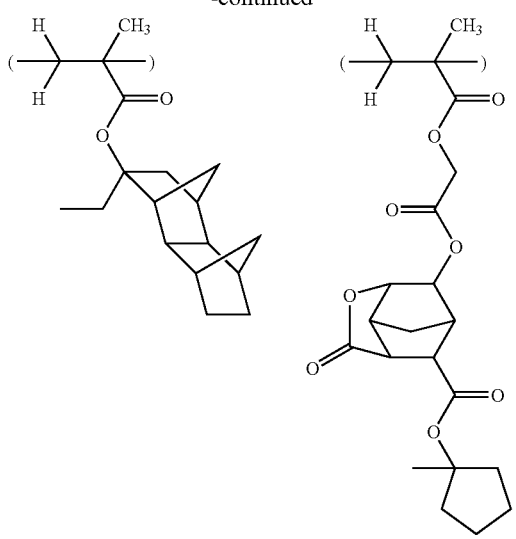
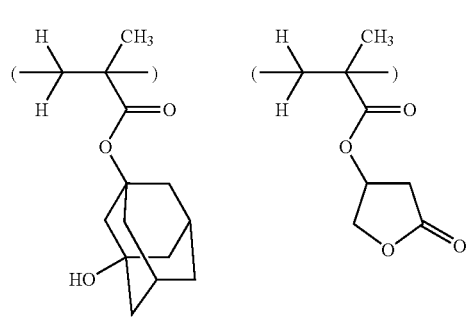
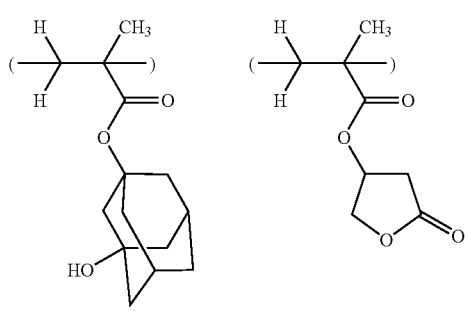
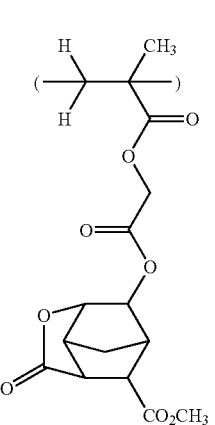
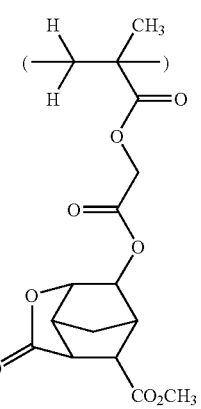

21
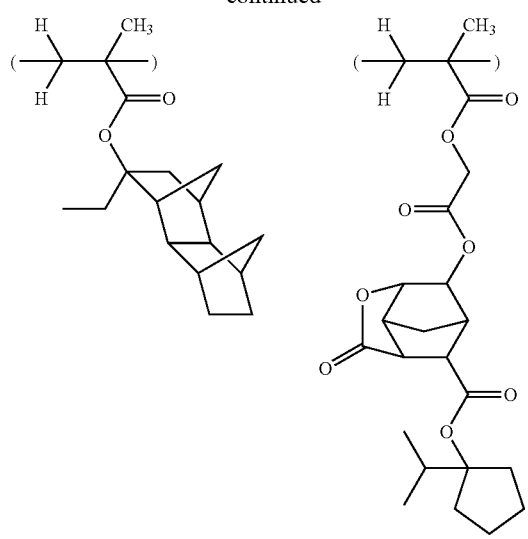
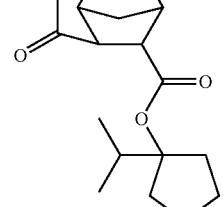
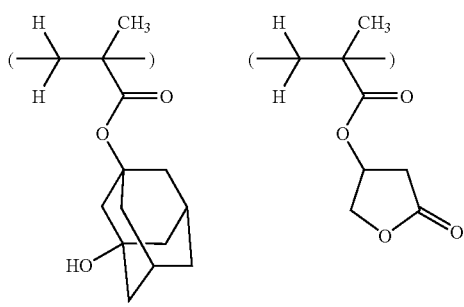
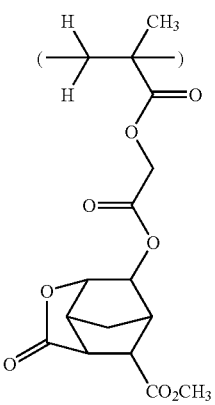
22
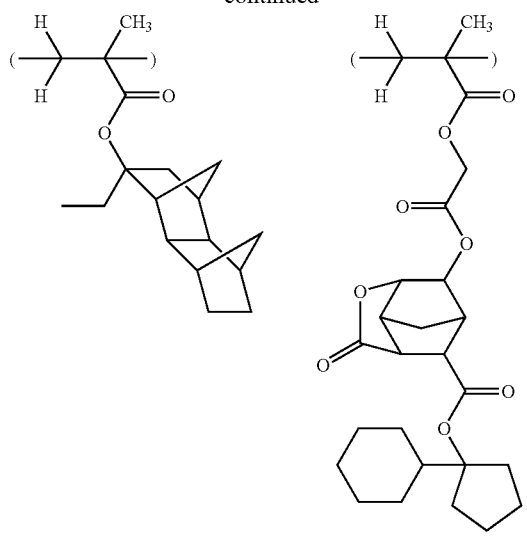
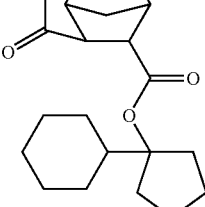
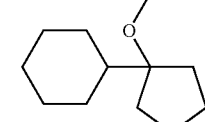
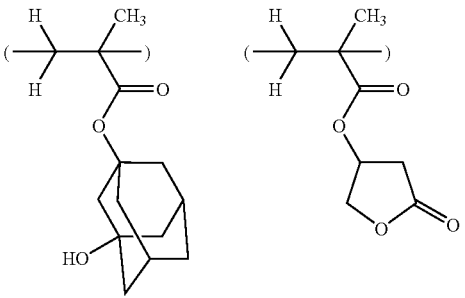
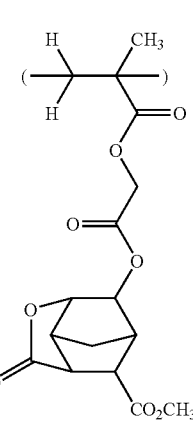

23
-continued
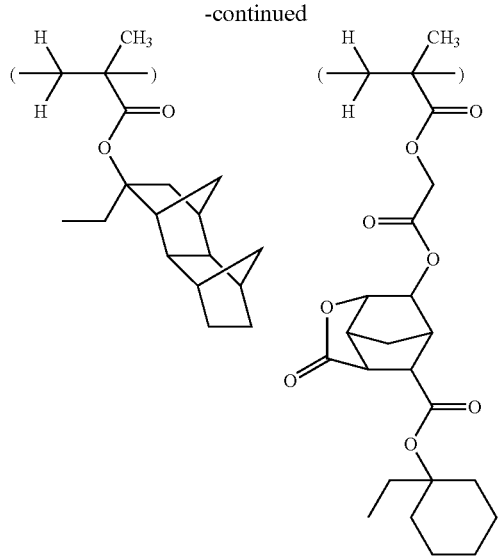
24
-continued
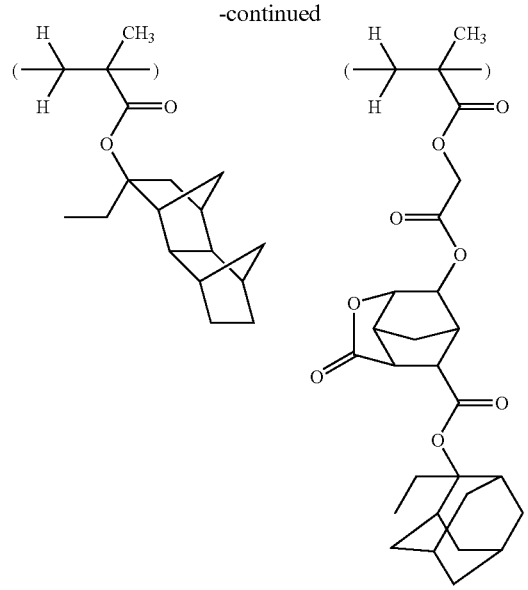
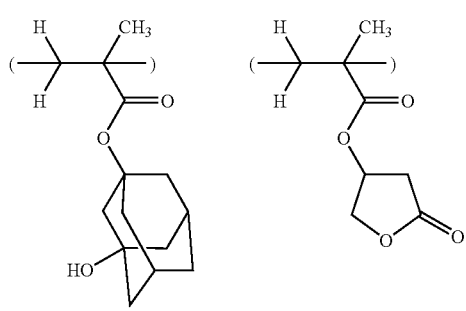
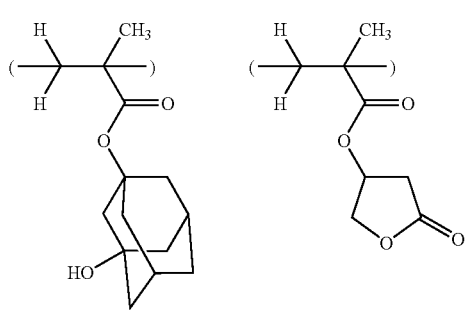
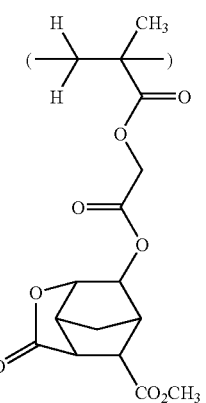
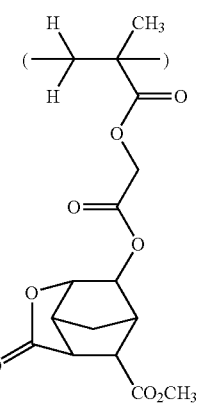

25
-continued
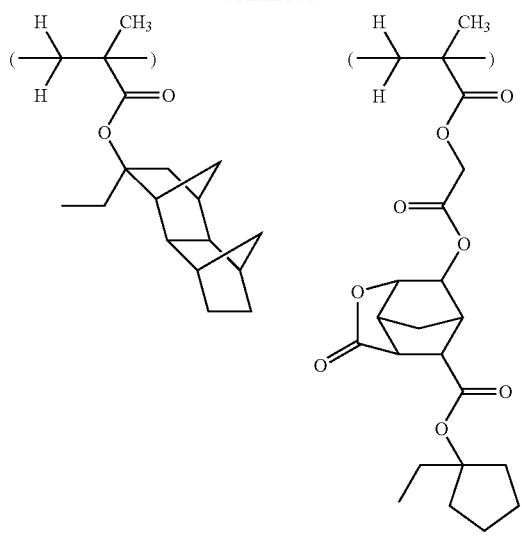
26
-continued
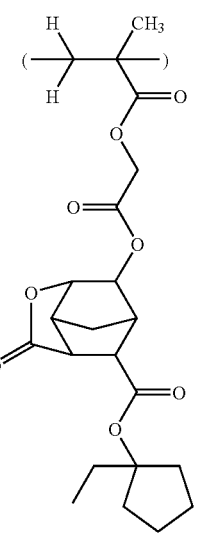
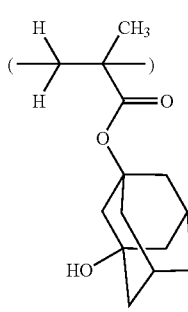
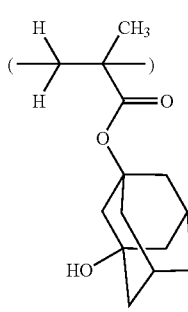
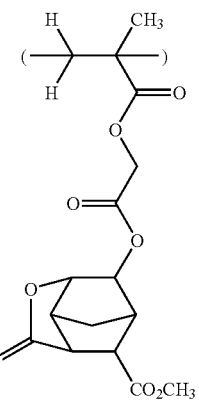
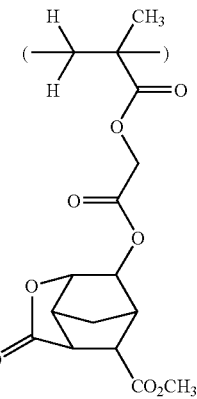

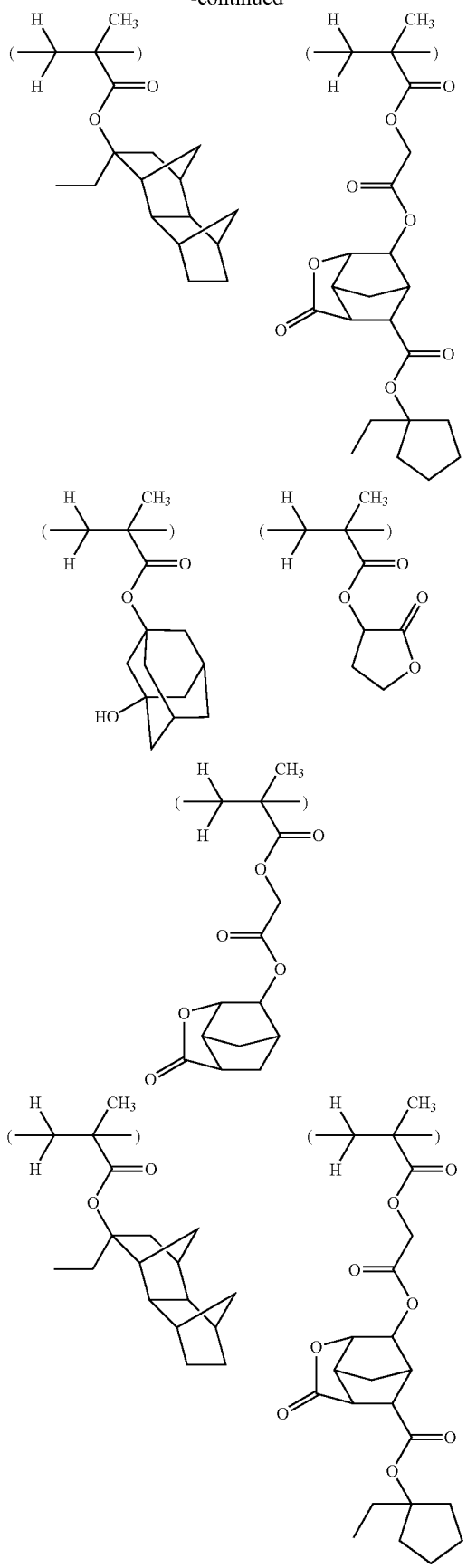
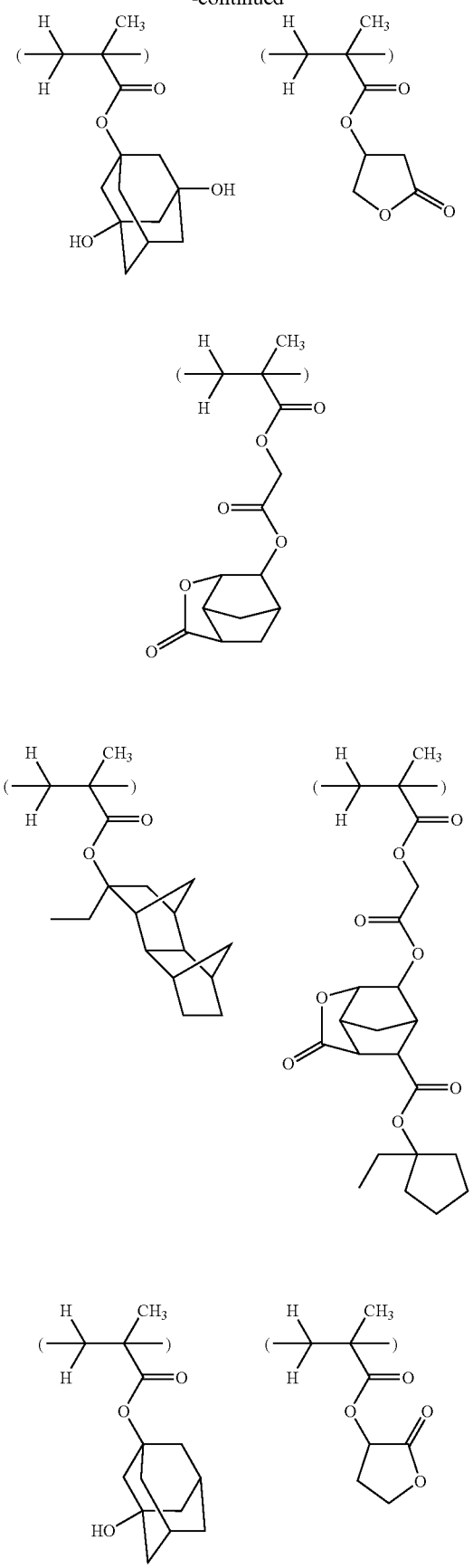

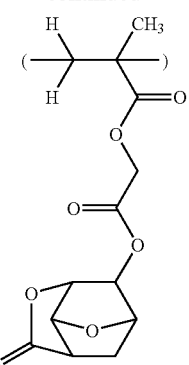
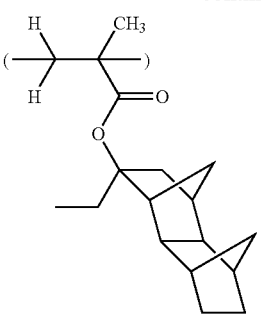
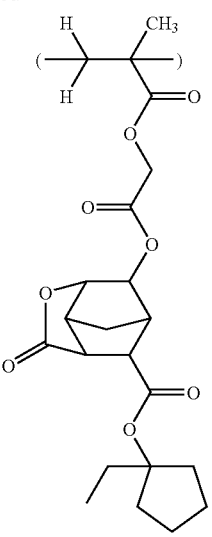
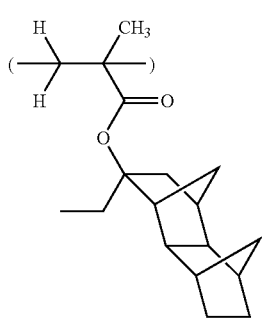
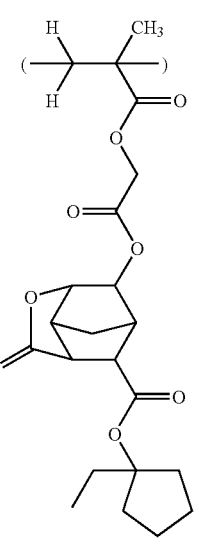
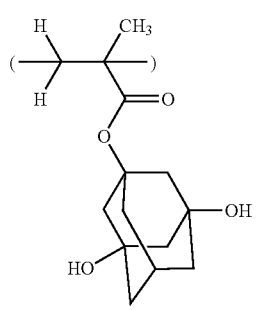
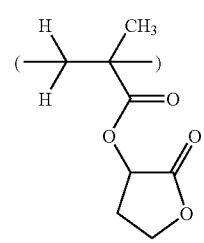
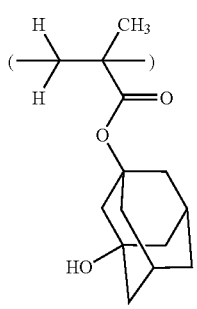
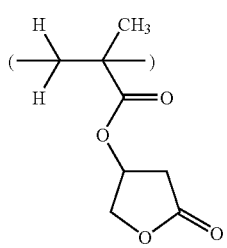
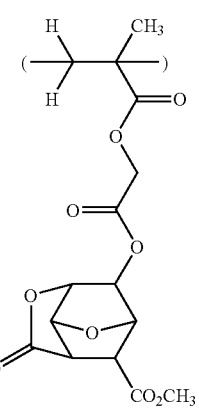

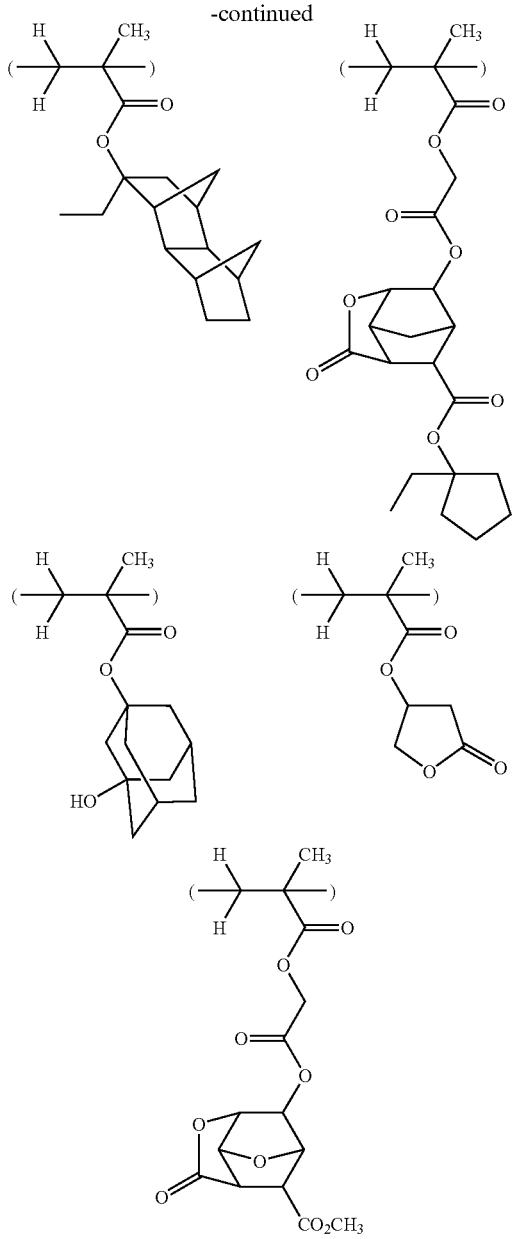

The polymer as resin component (A) should preferably have a weight average molecular weight (Mw) of 1,000 to 50,000, and more preferably 2,000 to 30,000, as measured by GPC versus polystyrene standards.

The polymer as resin component (A) may be obtained through copolymerization of (meth)acrylic ester derivative monomers corresponding to the respective recurring units by any well-known technique such as radical polymerization. It is noted that the polymers used in Examples to be described later were synthesized from preselected (meth)acrylic ester derivative monomers by a standard radical polymerization technique.

Component B

The compound capable of generating an acid in response to actinic light or radiation (B) is preferably one or more compound selected from sulfonium salt compounds having the general formula (3).

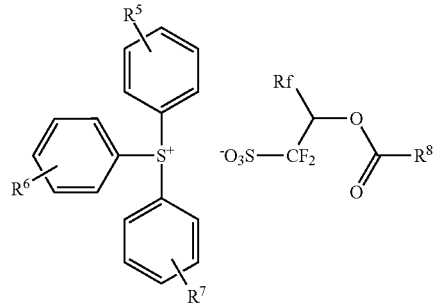

Herein $R^5$, $R^6$ and $R^7$ are each independently hydrogen or a straight, branched or cyclic, monovalent hydrocarbon group of 1 to 20 carbon atoms which may contain a heteroatom(s). Exemplary hydrocarbon groups include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl, and modified forms of the foregoing in which any carbon-carbon bond is separated by a hetero atomic group such as —O—, —S—, —SO—, —SO$_2$—, —NH—, —C(=O)—, —C(=O)O— or —C(=O)NH— or in which any hydrogen atom is substituted by a functional group such as —OH, —NH$_2$, —CHO, or —CO$_2$H. Rf is hydrogen or trifluoromethyl. $R^8$ is a straight, branched or cyclic, monovalent hydrocarbon group of 7 to 30 carbon atoms which may contain a heteroatom(s), examples of which are given below, but not limited thereto.

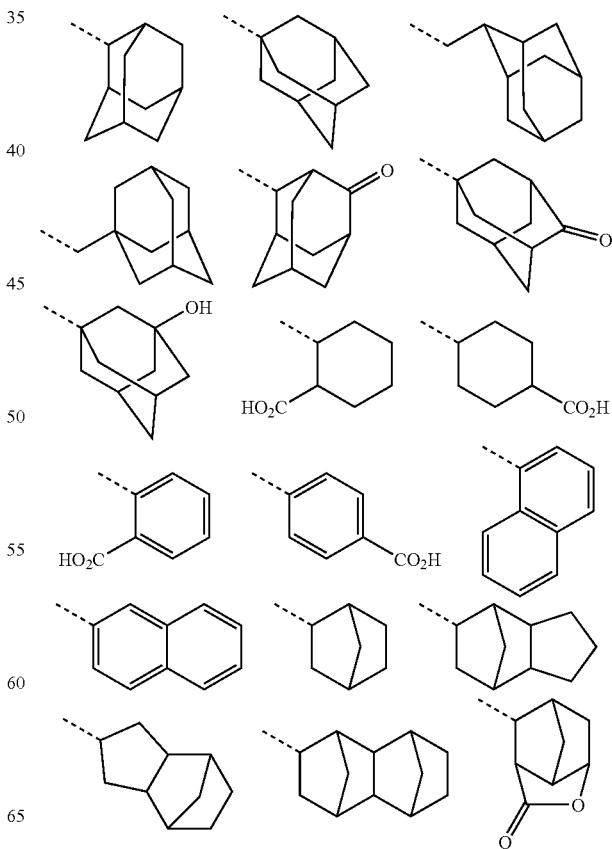

-continued
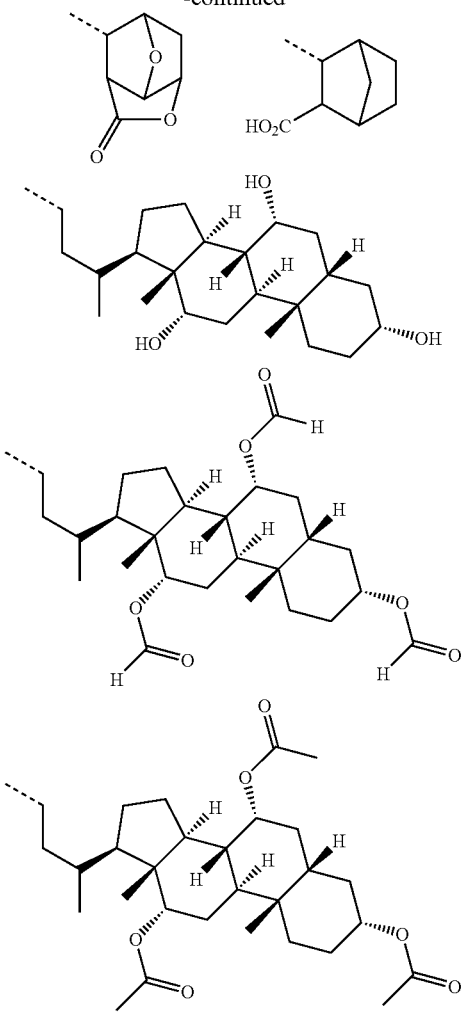
Note that the broken line denotes a valence bond.
Preferred examples of the compound (B) are given below, but not limited thereto.
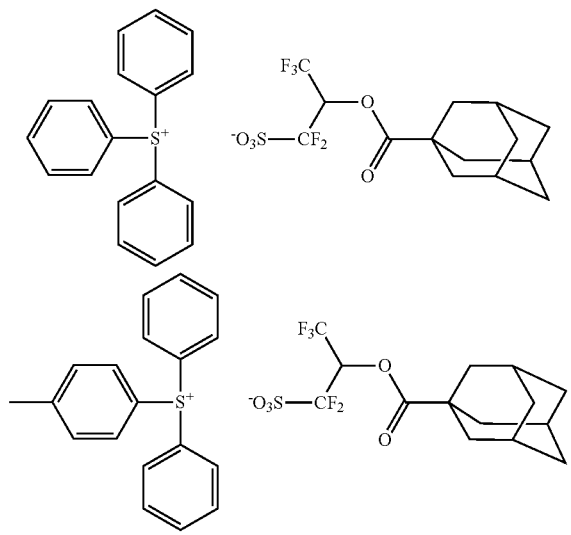
-continued
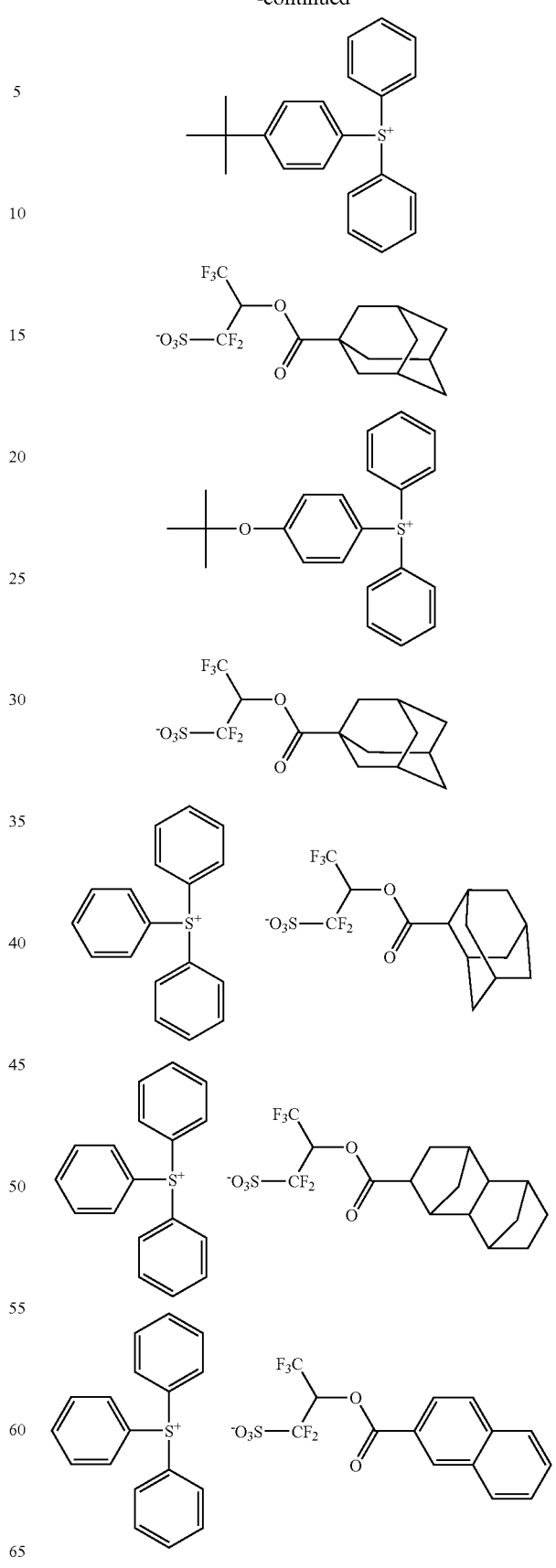

35
-continued
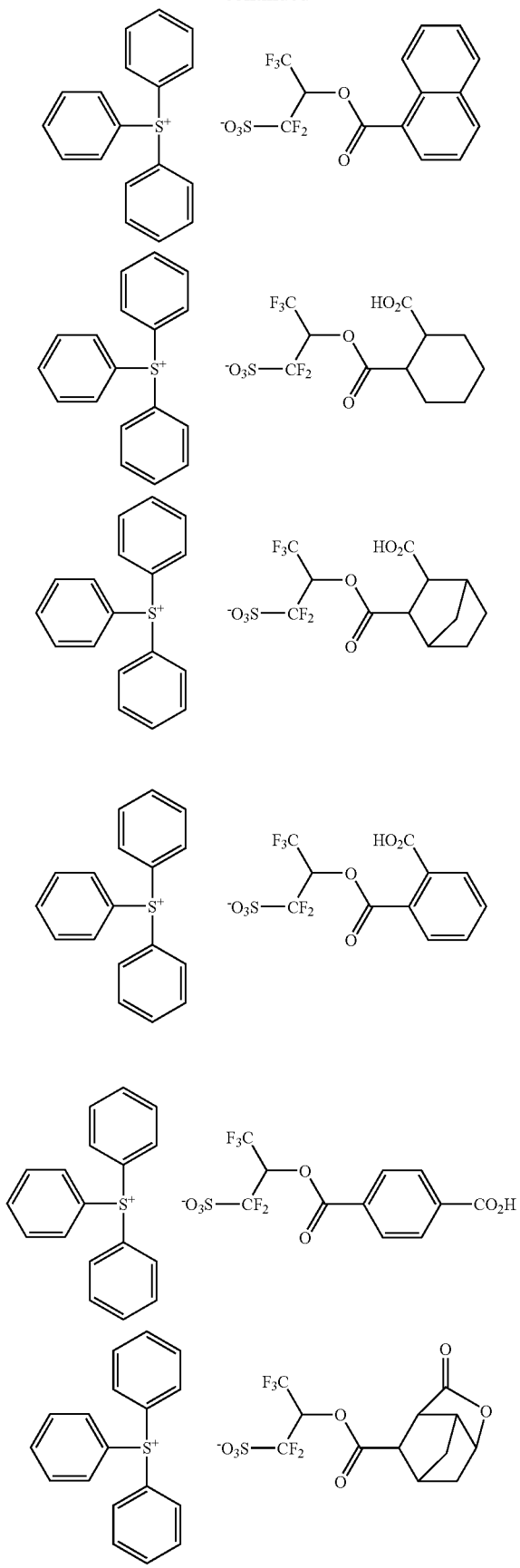
36
-continued
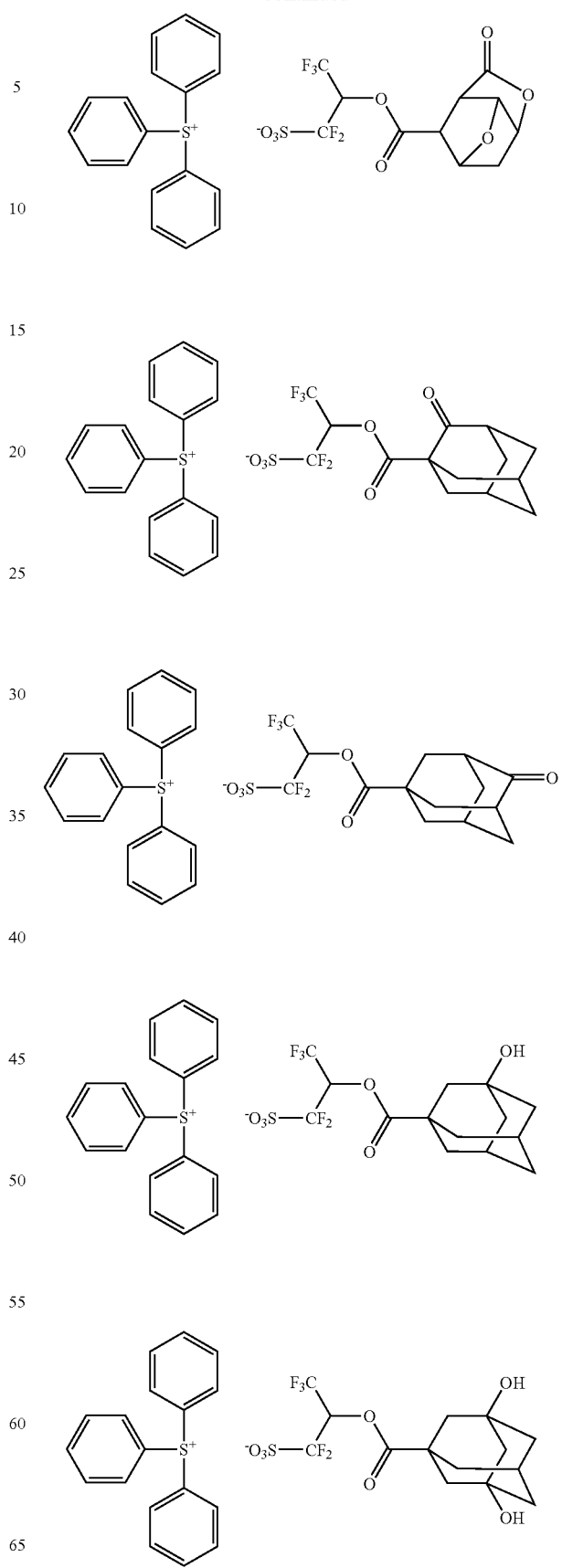

-continued

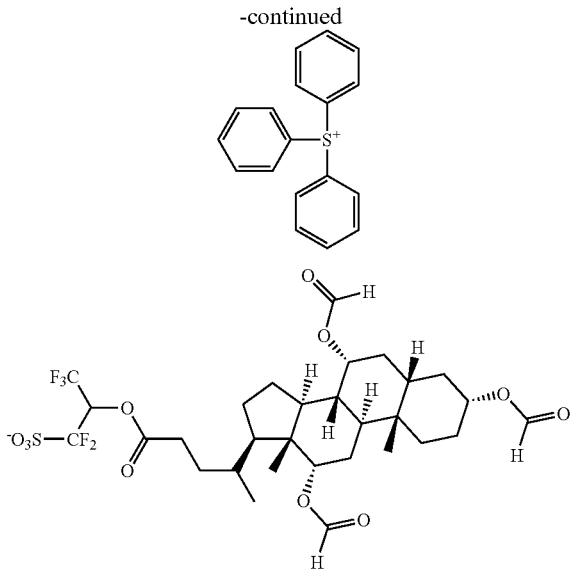

Other Components

In addition to resin component (A) comprising a polymer comprising recurring units having formula (1), the resist composition of the invention may further comprise another resin component.

The resin component other than resin component (A) that can be added to the resist composition includes, but is not limited to, polymers comprising units of the following formula (R1) and having a Mw of 1,000 to 100,000, especially 3,000 to 30,000, as measured by GPC versus polystyrene standards.

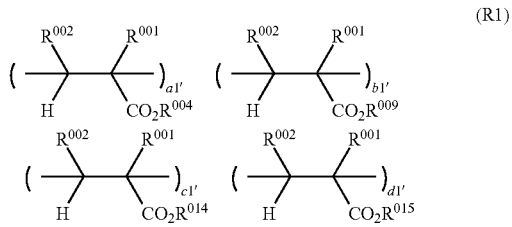
(R1)

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-(trifluoromethyl)ethyl]cyclohexyl, and bis[2,2,2-trifluoro-1-hydroxy-1-(trifluoromethyl)ethyl]-cyclohexyl.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, norbornylmethyl, and adamantylmethyl as well as alkyl- or cycloalkyl-substituted forms of the foregoing.

$R^{015}$ is an acid labile group which is deprotected with the acid generated by the photoacid generator described above. It may be any of well-known acid labile groups commonly used in prior art resist compositions, especially chemically amplified resist compositions.

The other polymer is blended in an amount of preferably 0 to 50 parts, more preferably 0 to 30 parts by weight, provided that the total of the resin component (A) and the other polymer is 100 parts by weight. Too much amounts of the other polymer may prevent the resin component (A) from exerting its own effect, probably resulting in a lower resolution and degraded pattern profile. The other polymer is not limited to one type and a mixture of two or more other polymers may be added. The use of plural polymers allows for easy adjustment of resist properties.

As the compound which generates an acid in response to actinic light or radiation (B), the resist composition of the invention may further comprise (B') such a compound other than the sulfonium compound of formula (3). Component (B') may be any compound which generates an acid upon exposure to high-energy radiation and specifically, any of well-known photoacid generators which are commonly used in prior art resist compositions, especially chemically amplified resist compositions. Suitable photoacid generators include sulfonium salts, iodonium salts, sulfonyldiazomethane, N-sulfonyloxyimide, and oxime-O-sulfonate acid generators. They may be used alone or in admixture of two or more.

In the resist composition, an appropriate amount of the photoacid generators (B) and (B') combined is, but not limited to, 0.1 to 40 parts, and especially 0.1 to 20 parts by weight per 100 parts by weight of the base polymer (i.e., resin component (A) and optional other resin component). Too high a proportion of the photoacid generators may give rise to problems of degraded resolution and foreign matter upon development and resist film peeling.

Provided that [B] and [B'] stand for the amounts of generators (B) and (B') added, respectively, the preferred blending proportion of generators (B) and (B') is $0.1 \le [B]/([B]+[B']) \le 1$, more preferably $0.3 \le [B]/([B]+[B']) \le 1$, and even more preferably $0.5 \le [B]/([B]+[B']) \le 1$. If a blending proportion of generator (B) is too low, then exposure dose dependency, pattern density dependency and/or mask fidelity may be degraded. The photoacid generators (B) and (B') each may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996). Examples of the acid-amplifier compound include tert-butyl-2-methyl-2-tosyloxymethyl acetoacetate and 2-phenyl-2-(2-tosyloxyethyl)-1,3-dioxolane, but are not limited thereto.

In addition to components (A) and (B), the resist composition may further comprise (C) an organic solvent and optionally (D) an organic nitrogen-containing compound, (E) a surfactant, and (F) other components.

The organic solvent (C) used herein may be any organic solvent in which the base resin, acid generator, and additives are soluble. Illustrative, non-limiting, examples of the organic solvent include ketones such as cyclohexanone and methyl amyl ketone; alcohols such as 3-methoxybutanol, 3-methyl- 3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

Although the amount of the organic solvent used may be determined as appropriate in accordance with the thickness of a film to be formed, the solvent is preferably used in an amount of 1,000 to 5,000 parts by weight per 100 parts by weight of the base polymer.

In the resist composition, an organic nitrogen-containing compound or compounds may be compounded as component (D). The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

The organic nitrogen-containing compound used herein may be any of well-known organic nitrogen-containing compounds which are commonly used in prior art resist compositions, especially chemically amplified resist compositions. Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

The organic nitrogen-containing compound is preferably formulated in an amount of 0.001 to 4 parts, and especially 0.01 to 2 parts by weight, per 100 parts by weight of the base polymer. Less than 0.001 part of the nitrogen-containing compound achieves no or little addition effect whereas more than 4 parts may result in too low a sensitivity.

The resist composition of the invention may include optional ingredients, for example, a surfactant which is commonly used for improving the coating characteristics. Optional ingredients may be added in conventional amounts so long as this does not compromise the objects of the invention.

Optionally, there may be added to the resist composition a polymer which will segregate at the top of a coating and functions to adjust a hydrophilic/hydrophobic balance at the surface, to enhance water repellency, or to prevent low-molecular-weight components from flowing into or out of the coating when the coating comes in contact with water or similar liquids. The functional polymer may be added in customary amounts as long as it does not compromise the objects of the invention.

Preferred examples of the functional polymer which will segregate at the coating top include polymers and copolymers comprising fluorinated units of one or more types, and copolymers comprising fluorinated units and other units. Illustrative examples of suitable fluorinated units and other units are shown below, but not limited thereto.

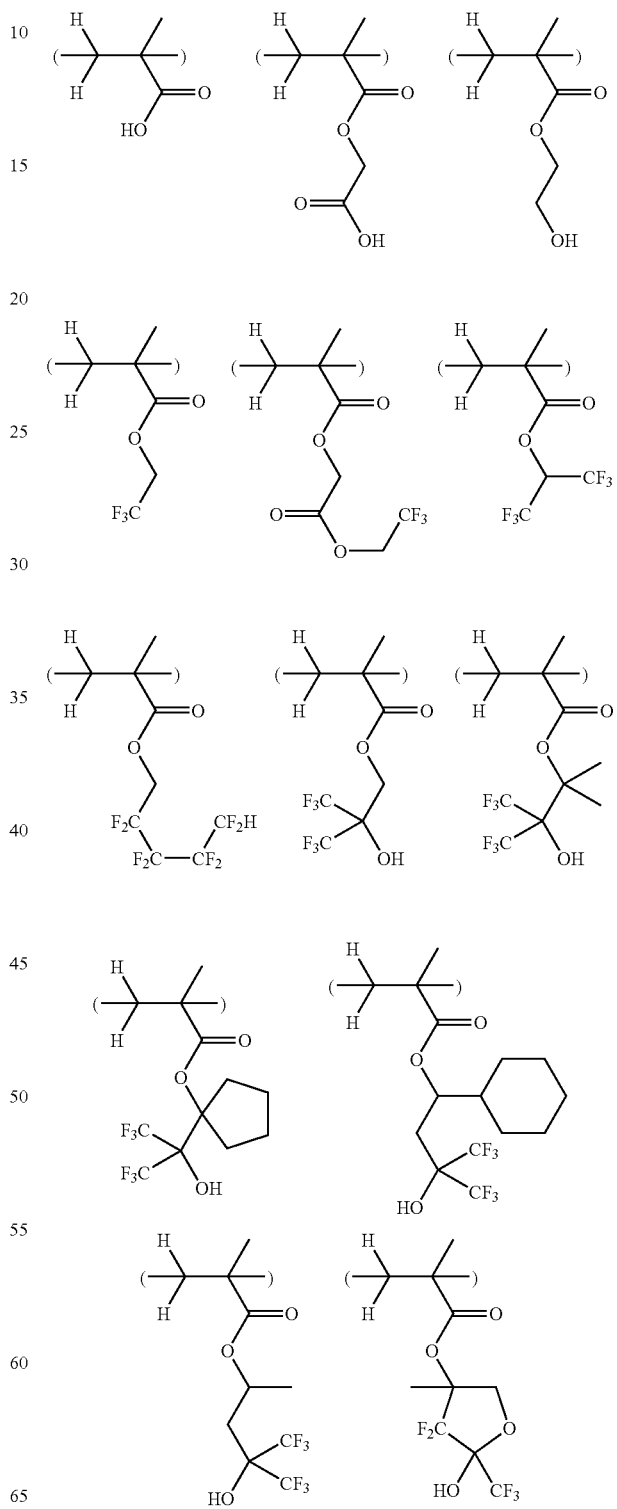

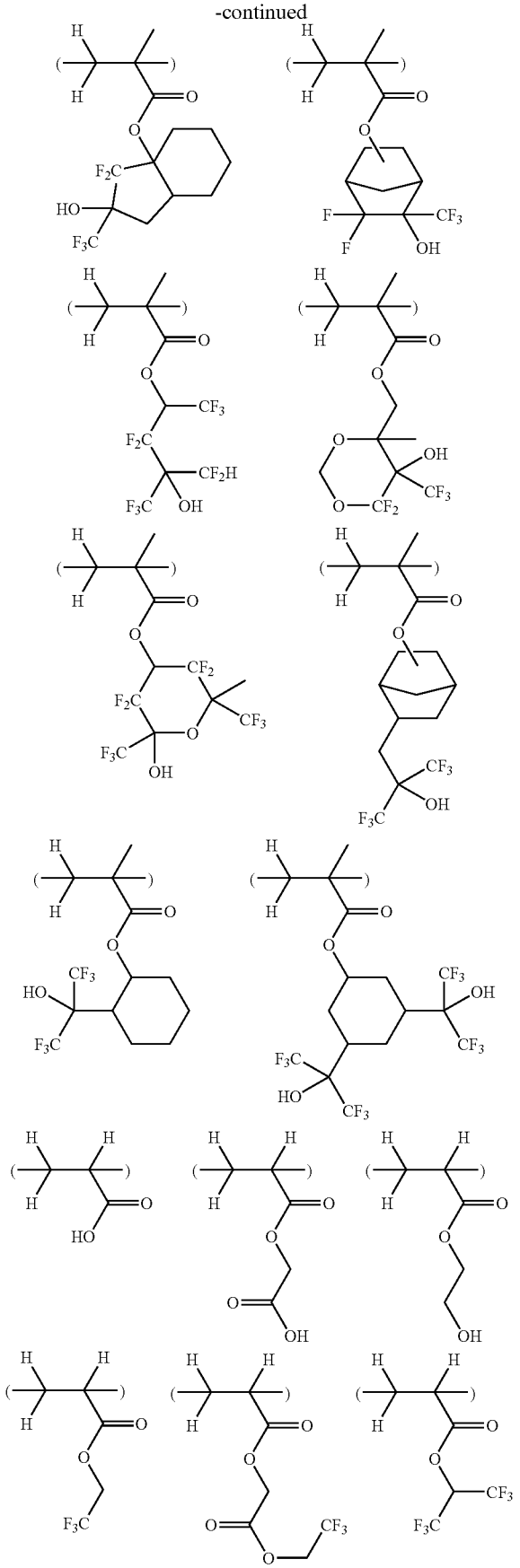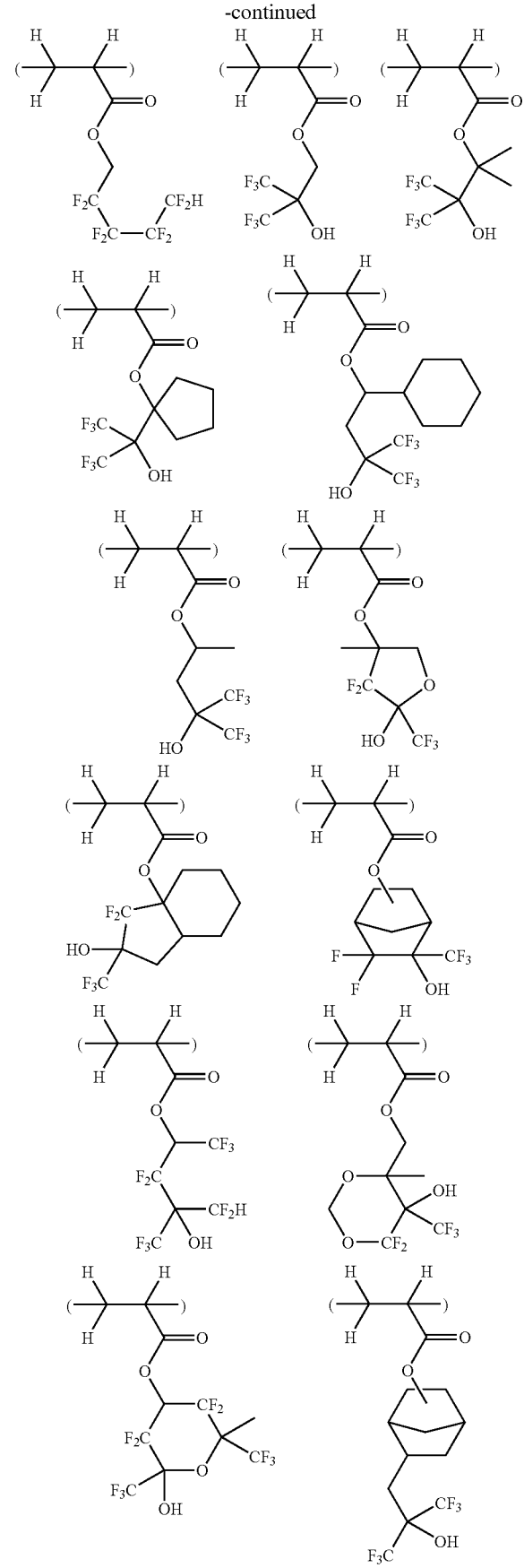

-continued

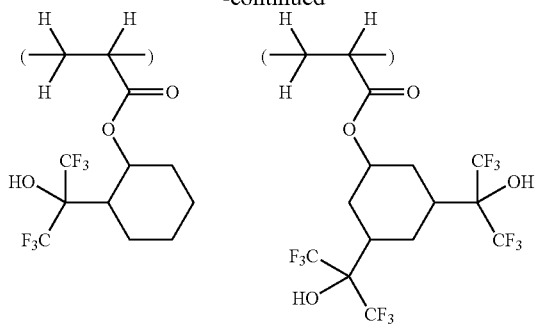

The functional polymer which will segregate at the coating top should preferably have a Mw of 1,000 to 50,000, more preferably 2,000 to 20,000, as measured by GPC versus polystyrene standards. Outside the range, the polymer may have insufficient surface-modifying effect or cause development defects.

Process

Pattern formation using the resist composition of the invention may be performed by well-known lithography processes. The process generally involves coating, heat treatment (or prebaking), exposure, heat treatment (PEB), and development. If necessary, any other steps may be added.

For pattern formation, the resist composition is first applied onto a substrate (on which an integrated circuit is to be formed, e.g., Si, $SiO_2$, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 140° C. for 1 to 5 minutes. The resulting resist film is generally 0.01 to 2.0 µm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, gases such as butane, ethane, propane, ethylene and acetylene are used. For the silicon-containing intermediate layer, either a coating method or a CVD method may be employed. The coating method uses silsesquioxane, polyhedral oligomeric silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing may be carried out for extracting the acid generator and the like from the film surface or washing away particles, or a protective film may be coated.

The resist film is then exposed to radiation such as UV, deep-UV, electron beam, x-ray, excimer laser light, γ-ray and synchrotron radiation through a mask having a desired pattern. The exposure dose is preferably about 1 to 200 mJ/cm², more preferably about 10 to 100 mJ/cm². The film is further baked (PEB) on a hot plate at 60 to 150° C. for 1 to 5 minutes, preferably 80 to 120° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 5 to 360 seconds, preferably 10 to 60 seconds by conventional techniques such as dip, puddle or spray techniques. In this way, a desired resist pattern is formed on the substrate. It is appreciated that the resist composition of the invention is suited for micro-patterning using such high-energy radiation as deep-UV with wavelength 254 to 193 nm, VUV with wavelength 157 nm, EUV, EB, soft x-ray, x-ray, excimer laser light, γ-ray and synchrotron radiation, and best suited for micro-patterning using high-energy radiation in the wavelength range of 180 to 200 nm.

Immersion lithography can be applied to the resist composition of the invention. The ArF immersion lithography uses a liquid having a refractive index of at least 1 and least absorptive to exposure radiation, such as deionized water or organic compounds as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer patterns is possible. The immersion lithography is important for the ArF lithography to survive to the 22-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking for preventing any dissolution from the resist and improving water slip on the film surface. The resist protective coating used in the immersion lithography is preferably formed from a solution of a polymer having 1,1,1,3,3,3-hexafluoro-2-propanol residue which is insoluble in water and soluble in an alkaline developer liquid, in a solvent selected from alcohols of at least 4 carbon atoms, ethers of 8 to 12 carbon atoms, and mixtures thereof.

EXAMPLE

Examples of the invention are given below by way of illustration and not by way of limitation. Me stands for methyl.

Preparation of Resist Composition

Examples and Comparative Examples

Resist compositions were prepared by mixing and dissolving a polymer, acid generator, and basic compound in a solvent according to the formulation shown in Table 1. They were filtered through a high-density polyethylene filter having a pore size of 0.02 µm, giving resist solutions. In all runs, the solvent contained 0.005 wt % of surfactant KH-20 (Asahi Glass Co., Ltd.).

Comparative resist compositions were similarly prepared according to the formulation shown in Table 2.

TABLE 1

| Resist | Resin | Acid generator | Base | Solvent 1 | Solvent 2 |
|---|---|---|---|---|---|
| R-01 | P-01 (80) | PAG-1 (15.2) | Base-1 (2.37) | PGMEA (1120) | CyHO (480) |
| R-02 | P-02 (80) | PAG-1 (15.2) | Base-1 (2.37) | PGMEA (1120) | CyHO (480) |
| R-03 | P-03 (80) | PAG-1 (15.2) | Base-1 (2.37) | PGMEA (1120) | CyHO (480) |
| R-04 | P-04 (80) | PAG-1 (15.2) | Base-1 (2.37) | PGMEA (1120) | CyHO (480) |
| R-05 | P-05 (80) | PAG-1 (15.2) | Base-1 (2.37) | PGMEA (1120) | CyHO (480) |
| R-06 | P-06 (80) | PAG-1 (15.2) | Base-1 (2.37) | PGMEA (1120) | CyHO (480) |
| R-07 | P-07 (80) | PAG-1 (15.2) | Base-1 (2.37) | PGMEA (1120) | CyHO (480) |
| R-08 | P-08 (80) | PAG-1 (15.2) | Base-1 (2.37) | PGMEA (1120) | CyHO (480) |
| R-09 | P-09 (80) | PAG-1 (15.2) | Base-1 (2.37) | PGMEA (1120) | CyHO (480) |
| R-10 | P-10 (80) | PAG-1 (15.2) | Base-1 (2.37) | PGMEA (1120) | CyHO (480) |
| R-11 | P-11 (80) | PAG-1 (15.2) | Base-1 (2.37) | PGMEA (1120) | CyHO (480) |
| R-12 | P-12 (80) | PAG-1 (15.2) | Base-1 (2.37) | PGMEA (1120) | CyHO (480) |
| R-13 | P-13 (80) | PAG-1 (15.2) | Base-1 (2.37) | PGMEA (1120) | CyHO (480) |
| R-14 | P-14 (80) | PAG-1 (15.2) | Base-1 (2.37) | PGMEA (1120) | CyHO (480) |
| R-15 | P-15 (80) | PAG-1 (15.2) | Base-1 (2.37) | PGMEA (1120) | CyHO (480) |
| R-16 | P-16 (80) | PAG-1 (15.2) | Base-1 (2.37) | PGMEA (1120) | CyHO (480) |
| R-17 | P-17 (80) | PAG-1 (15.2) | Base-1 (2.37) | PGMEA (1120) | CyHO (480) |
| R-18 | P-18 (80) | PAG-1 (15.2) | Base-1 (2.37) | PGMEA (1120) | CyHO (480) |
| R-19 | P-19 (80) | PAG-1 (15.2) | Base-1 (2.37) | PGMEA (1120) | CyHO (480) |
| R-20 | P-01 (80) | PAG-2 (16.5) | Base-2 (2.37) | PGMEA (1120) | CyHO (480) |
| R-21 | P-01 (80) | PAG-3 (15.5) | Base-3 (2.37) | PGMEA (1120) | CyHO (480) |
| R-22 | P-01 (80) | PAG-1 (7.6) PAG-4 (10.2) | Base-1 (2.37) | PGMEA (1120) | CyHO (480) |

TABLE 2

| Resist | Resin | Acid generator | Base | Solvent 1 | Solvent 2 |
|---|---|---|---|---|---|
| R-23 | P-20 (80) | PAG-1 (15.2) | Base-1 (2.37) | PGMEA (1120) | CyHO (480) |
| R-24 | P-21 (80) | PAG-1 (15.2) | Base-1 (2.37) | PGMEA (1120) | CyHO (480) |
| R-25 | P-22 (80) | PAG-1 (15.2) | Base-1 (2.37) | PGMEA (1120) | CyHO (480) |
| R-26 | P-23 (80) | PAG-1 (15.2) | Base-1 (2.37) | PGMEA (1120) | CyHO (480) |
| R-27 | P-24 (80) | PAG-1 (15.2) | Base-1 (2.37) | PGMEA (1120) | CyHO (480) |
| R-28 | P-25 (80) | PAG-1 (15.2) | Base-1 (2.37) | PGMEA (1120) | CyHO (480) |
| R-29 | P-26 (80) | PAG-1 (15.2) | Base-1 (2.37) | PGMEA (1120) | CyHO (480) |
| R-30 | P-27 (80) | PAG-1 (15.2) | Base-1 (2.37) | PGMEA (1120) | CyHO (480) |

In Tables 1 and 2, numerical values in parentheses are in parts by weight. The abbreviations for the basic compounds and solvents have the following meaning.
Base-1: 2-cyclohexylcarboxyethylmorpholine
PGMEA: 1-methoxyisopropyl acetate
CyHO: cyclohexanone
Polymers designated P-01 to P-27 are as shown in Tables 3 to 9.

TABLE 3

| Resin | Unit 1 (ratio) | Unit 2 (ratio) | Unit 3 (ratio) | Unit 4 (ratio) | Unit 5 (ratio) | Mw |
|---|---|---|---|---|---|---|
| P-01 | A-1 (0.10) | B-1 (0.25) | C-1 (0.25) | D-1 (0.10) | E-2 (0.30) | 7,000 |
| P-02 | A-1 (0.10) | B-1 (0.20) | C-1 (0.20) | D-1 (0.15) | E-2 (0.25) | 7,000 |
| P-03 | A-2 (0.20) | B-1 (0.20) | C-1 (0.20) | D-1 (0.15) | E-2 (0.25) | 6,200 |
| P-04 | A-3 (0.30) | B-1 (0.20) | C-1 (0.10) | D-1 (0.15) | E-2 (0.25) | 7,200 |
| P-05 | A-4 (0.10) | B-1 (0.25) | C-1 (0.25) | D-1 (0.10) | E-2 (0.30) | 6,500 |
| P-06 | A-5 (0.10) | B-1 (0.25) | C-1 (0.25) | D-1 (0.10) | E-2 (0.30) | 6,900 |
| P-07 | A-1 (0.10) | B-2 (0.25) | C-1 (0.25) | D-1 (0.10) | E-2 (0.30) | 7,200 |
| P-08 | A-1 (0.10) | B-3 (0.25) | C-1 (0.25) | D-1 (0.10) | E-2 (0.30) | 6,700 |
| P-09 | A-1 (0.10) | B-4 (0.25) | C-1 (0.25) | D-1 (0.10) | E-2 (0.30) | 7,100 |
| P-10 | A-1 (0.10) | B-1 (0.20) | C-2 (0.30) | D-1 (0.15) | E-2 (0.25) | 7,300 |
| P-11 | A-1 (0.10) | B-1 (0.20) | C-3 (0.30) | D-1 (0.15) | E-2 (0.25) | 6,900 |
| P-12 | A-1 (0.10) | B-1 (0.20) | C-4 (0.30) | D-1 (0.15) | E-2 (0.25) | 6,700 |
| P-13 | A-1 (0.10) | B-1 (0.20) | C-5 (0.30) | D-1 (0.15) | E-2 (0.25) | 6,800 |
| P-14 | A-1 (0.10) | B-1 (0.20) | C-6 (0.30) | D-1 (0.15) | E-2 (0.25) | 7,100 |
| P-15 | A-1 (0.10) | B-1 (0.20) | C-1 (0.30) | D-1 (0.15) | E-1 (0.25) | 7,000 |

TABLE 3-continued

| Resin | Unit 1 (ratio) | Unit 2 (ratio) | Unit 3 (ratio) | Unit 4 (ratio) | Unit 5 (ratio) | Mw |
|---|---|---|---|---|---|---|
| P-16 | A-1 (0.10) | B-1 (0.20) | C-1 (0.30) | D-2 (0.15) | E-2 (0.25) | 7,000 |
| P-17 | A-2 (0.35) | B-1 (0.25) | | D-1 (0.10) | E-2 (0.30) | 6,900 |
| P-18 | A-5 (0.35) | B-3 (0.25) | | D-1 (0.10) | E-2 (0.30) | 6,500 |
| P-19 | A-2 (0.30) | B-1 (0.35) | | D-1 (0.10) | E-1 (0.25) | 6,600 |

The "ratio" is a molar ratio of a certain unit incorporated in the polymer.

TABLE 4

| Resin | Unit 1 (ratio) | Unit 2 (ratio) | Unit 3 (ratio) | Unit 4 (ratio) | Unit 5 (ratio) | Mw |
|---|---|---|---|---|---|---|
| P-20 | C-4 (0.10) | B-1 (0.20) | C-1 (0.30) | D-1 (0.15) | E-2 (0.25) | 6,200 |
| P-21 | A-1 (0.10) | B-5 (0.40) | C-1 (0.30) | D-1 (0.20) | | 6,800 |
| P-22 | C-4 (0.10) | B-7 (0.20) | C-1 (0.30) | D-1 (0.15) | E-1 (0.25) | 6,600 |
| P-23 | A-3 (0.10) | B-6 (0.20) | C-1 (0.30) | D-2 (0.15) | E-2 (0.25) | 6,900 |
| P-24 | A-3 (0.35) | B-5 (0.35) | | D-1 (0.05) | E-1 (0.25) | 6,700 |
| P-25 | A-1 (0.35) | | C-1 (0.25) | D-1 (0.10) | E-2 (0.30) | 6,500 |
| P-26 | | B-1 (0.35) | C-1 (0.25) | D-1 (0.10) | E-2 (0.30) | 6,500 |
| P-27 | | B-1 (0.30) | C-1 (0.30) | D-1 (0.15) | E-1 (0.25) | 6,600 |

The "ratio" is a molar ratio of a certain unit incorporated in the polymer.

TABLE 5
| A-1 | A-2 |
|---|---|
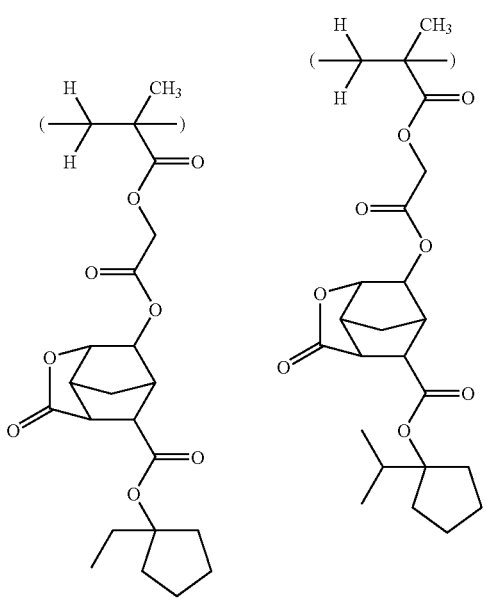
| A-3 | A-4 |
|---|---|
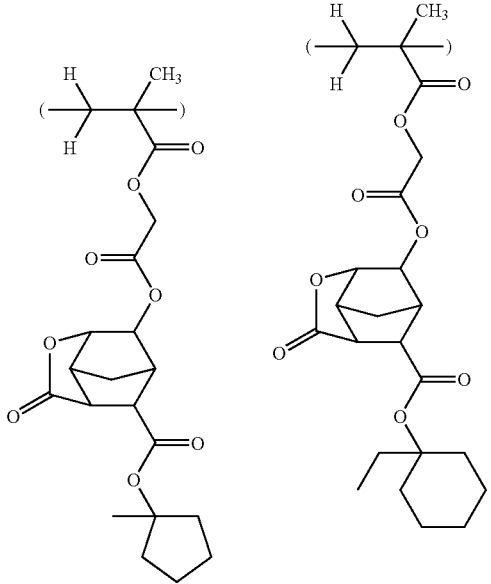
TABLE 5-continued
| A-5 |
|---|
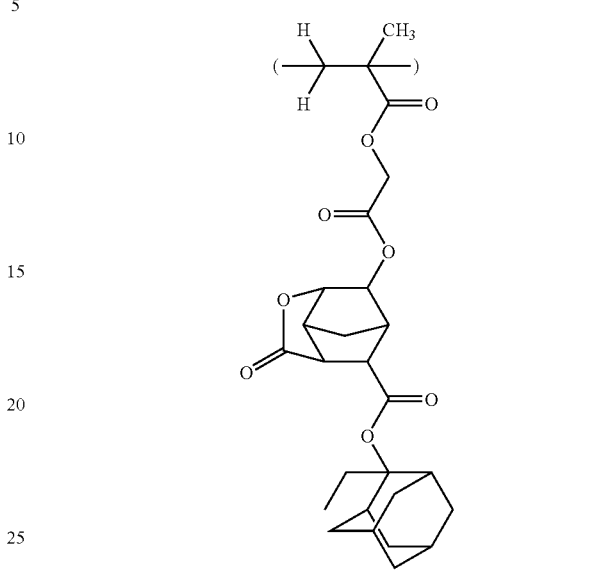
TABLE 6
| B-1 | B-2 |
|---|---|
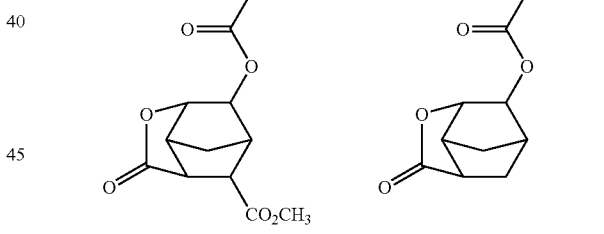
| B-3 | B-4 |
|---|---|
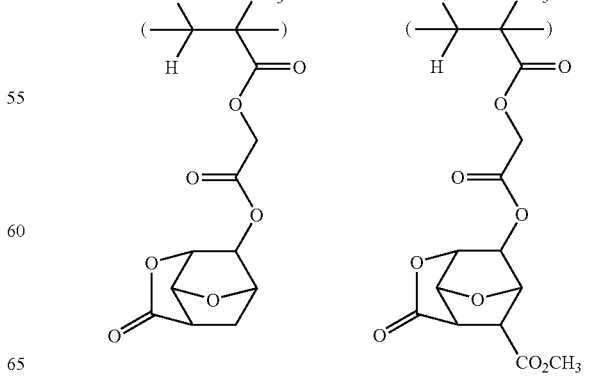

TABLE 6-continued
| B-5 | B-6 |
|---|---|
| 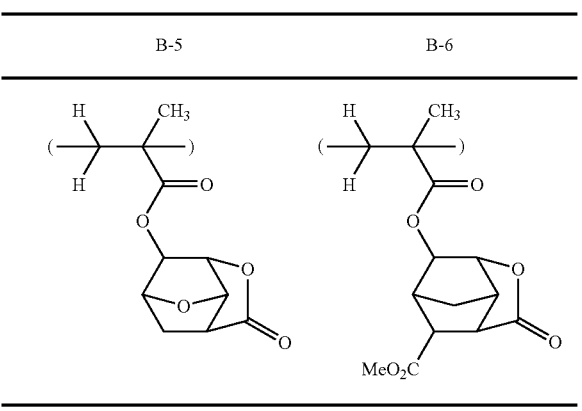 | |
| B-7 |
|---|
| 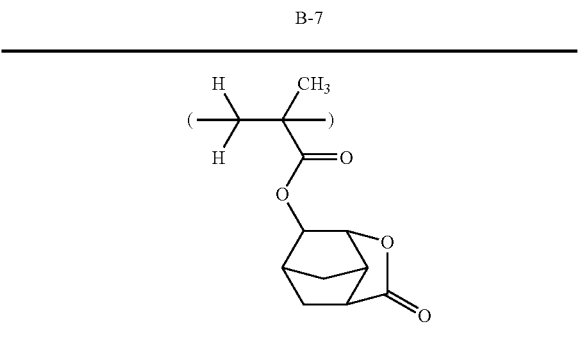 |
TABLE 7
| C-1 | C-2 |
|---|---|
| 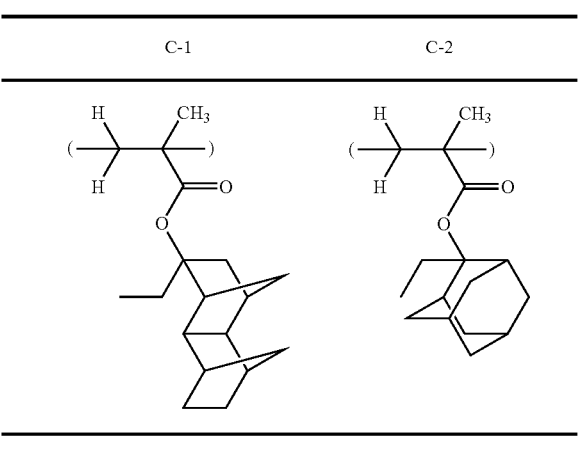 | |
| C-3 | C-4 |
|---|---|
| 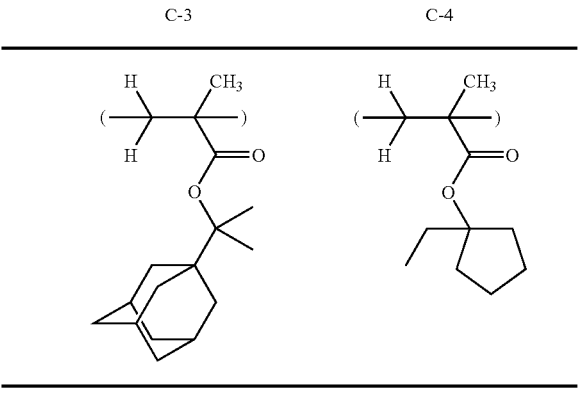 | |
TABLE 7-continued
| C-5 | C-6 |
|---|---|
| 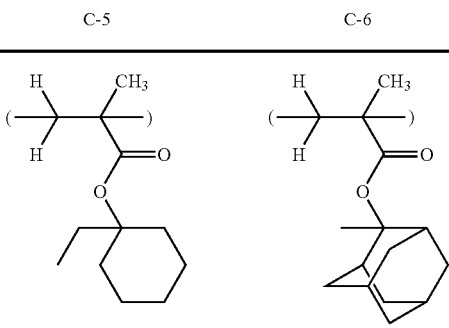 | |
TABLE 8
| D-1 | D-2 |
|---|---|
| 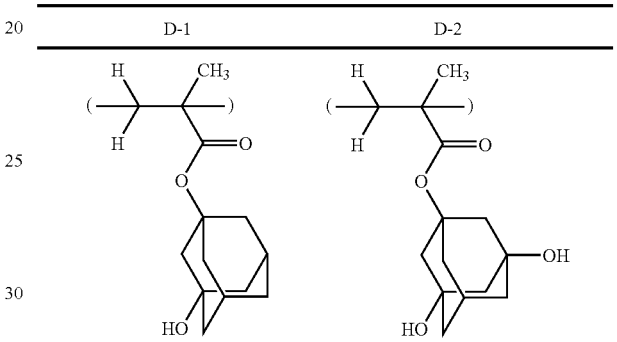 | |
TABLE 9
| E-1 | E-2 |
|---|---|
| 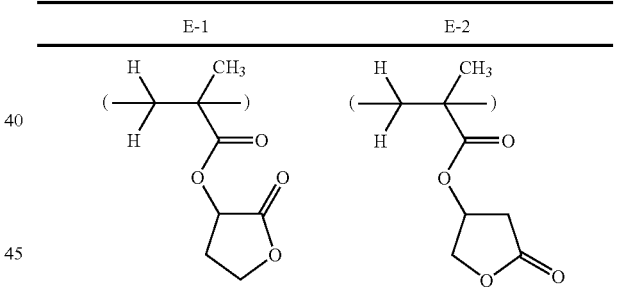 | |
The acid generators designated by abbreviation PAG in Tables 1 and 2 are the sulfonium salt compounds shown in Table 10.
TABLE 10
| PAG-1 |
|---|
| 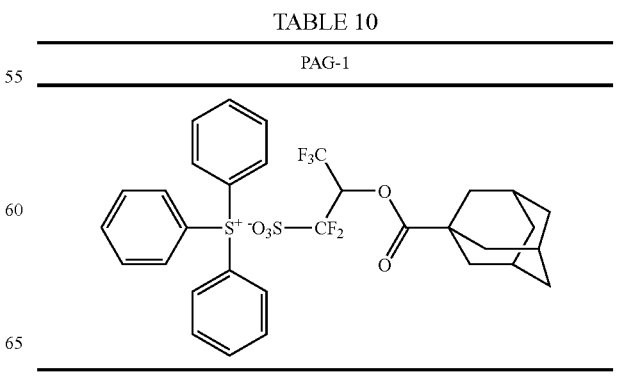 |

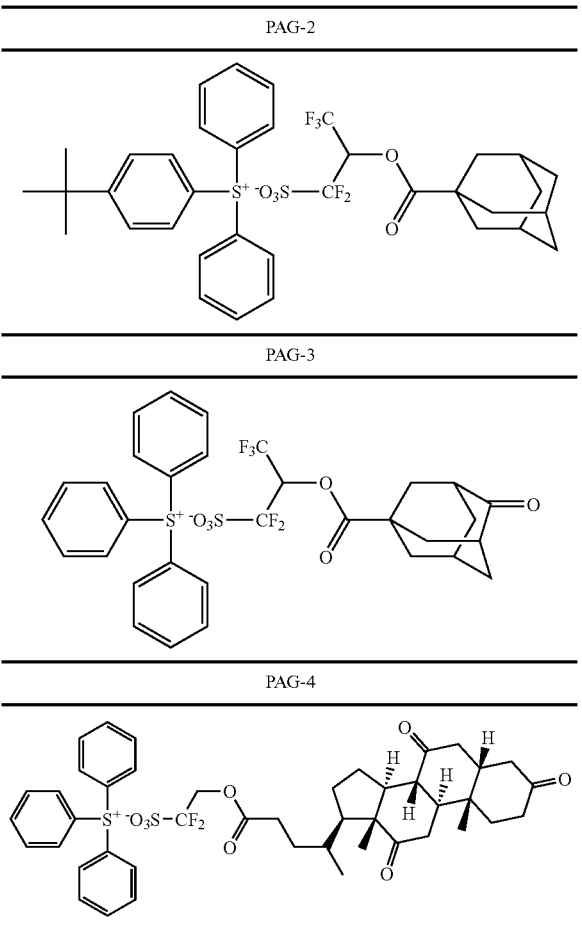

Evaluation of Resist Compositions

Examples 1 to 22 & Comparative Examples 1 to 8

Each of inventive resist compositions R-01 to 22 and comparative resist compositions R-23 to 30, prepared above, was spin coated on a silicon wafer having an antireflective coating (ARC-29A, by Nissan Chemical Co., Ltd.) of 78 nm thick and baked at 90° C. for 60 seconds to form a resist film of 100 nm thick. Using an immersion ArF excimer laser stepper (Nikon Corp., NA 1.30), the resist film was transfer exposed through a 6% halftone phase shift mask having a predetermined pattern drawn, post-exposure baked (PEB) at 90° C. for 60 seconds, and puddle developed with a 2.38 wt % aqueous solution of tetramethylammonium hydroxide for 30 seconds. In this way, a line-and-space pattern was formed.

The pattern-bearing wafers were observed under a top-down scanning electron microscope (TDSEM). The optimum exposure was an exposure dose (mJ/cm$^2$) capable of resolution of a 42-nm 1:1 line-and-space transfer mask pattern to a repetition of 42-nm lines at a pitch of 84 nm. After a 84-nm pitch line-and-space pattern designed such that the line pattern after transfer increased at an increment of 2 nm from 38 nm to 46 nm was printed at the optimum exposure, the line width of the resist pattern was measured under SEM. The line width of the resist pattern was plotted relative to the line width of the mask, from which a slope was computed by linear approximation and reported as a mask error enhancement factor (MEEF). A smaller value of MEEF is better because it indicates that the influence of a finish error of the mask pattern is minimized. Further a width variation of lines of a 42-nm 1:1 line-and-space pattern was measured under SEM and reported as line width roughness (LWR). A smaller value of LWR is better because it indicates minimized fluctuation of a line pattern.

Tables 11 and 12 tabulate the test results (MEEF and LWR) of the inventive and comparative resist compositions, respectively.

TABLE 11

| Example | Resist | Optimum exposure (mJ/cm$^2$) | MEEF | LWR (3σ) |
|---|---|---|---|---|
| 1 | R-01 | 35.7 | 2.7 | 5.6 |
| 2 | R-02 | 34.0 | 2.9 | 5.4 |
| 3 | R-03 | 29.6 | 2.6 | 5.3 |
| 4 | R-04 | 36.5 | 2.8 | 5.0 |
| 5 | R-05 | 30.2 | 2.1 | 4.2 |
| 6 | R-06 | 37.5 | 2.4 | 4.9 |
| 7 | R-07 | 35.6 | 2.4 | 4.8 |
| 8 | R-08 | 35.0 | 2.5 | 5.6 |
| 9 | R-09 | 34.3 | 2.9 | 4.8 |
| 10 | R-10 | 37.2 | 2.2 | 4.2 |
| 11 | R-11 | 41.2 | 2.9 | 4.8 |
| 12 | R-12 | 33.0 | 2.7 | 4.4 |
| 13 | R-13 | 32.4 | 2.0 | 4.8 |
| 14 | R-14 | 39.6 | 2.8 | 4.3 |
| 15 | R-15 | 33.2 | 2.8 | 5.5 |
| 16 | R-16 | 35.6 | 2.5 | 4.0 |
| 17 | R-17 | 26.5 | 2.5 | 5.1 |
| 18 | R-18 | 32.0 | 2.6 | 4.6 |
| 19 | R-19 | 24.5 | 2.5 | 4.7 |
| 20 | R-20 | 36.5 | 2.6 | 5.6 |
| 21 | R-21 | 36.1 | 2.5 | 5.5 |
| 22 | R-22 | 40.8 | 2.2 | 5.9 |

TABLE 12

| Comparative Example | Resist | Optimum exposure (mJ/cm$^2$) | MEEF | LWR (3σ) |
|---|---|---|---|---|
| 1 | R-23 | 30.5 | 3.5 | 6.1 |
| 2 | R-24 | 32.0 | 2.4 | 7.5 |
| 3 | R-25 | 34.2 | 2.8 | 8.3 |
| 4 | R-26 | 31.5 | 3.5 | 5.4 |
| 5 | R-27 | 28.3 | 3.6 | 5.5 |
| 6 | R-28 | 22.0 | 3.9 | 5.8 |
| 7 | R-29 | 29.3 | 3.4 | 6.1 |
| 8 | R-30 | 28.0 | 3.1 | 6.2 |

It is seen from the results of Table 11 that the resist compositions (Examples 1 to 22) within the scope of the invention exhibit excellent MEEF performance and minimized LWR. In contrast, Table 12 reveals that Comparative Examples 1 to 8, which use prior art resins, have the drawback of inferior MEEF performance or LWR minimization failure.

It was demonstrated that in contrast to the prior art design, a resist composition comprising a polymer comprising specific recurring units as a base resin can form a pattern having reduced LWR without concomitant degradation of MEEF performance when processed by the photolithography.

Japanese Patent Application No. 2009-135113 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising:
(A) a resin component which becomes soluble in an alkaline developer under the action of an acid and
(B) a compound capable of generating an acid in response to actinic light or radiation, wherein said resin component (A) is a polymer comprising recurring units represented by the general formula (2):

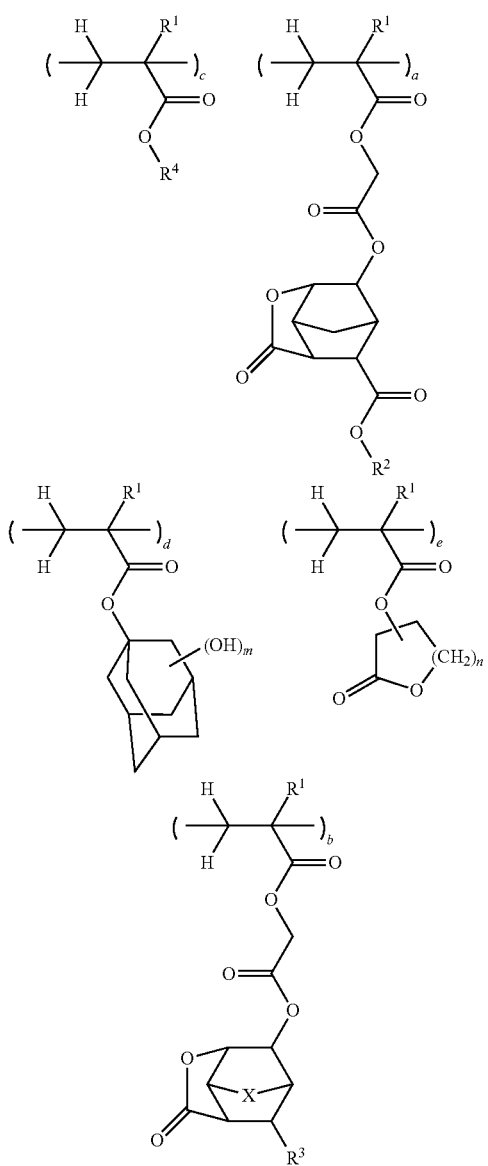

wherein $R^1$ is each independently hydrogen, methyl or trifluoromethyl, $R^2$ and $R^4$ each are an acid labile group, $R^3$ is $CO_2CH_3$, X is O, S, $CH_2$ or $CH_2CH_2$, m is 1 or 2, n is 1 or 2, a, b, c, d and e are indicative of ratios of the respective units incorporated, $0.05 \le a \le 0.4$, $0.05 \le b \le 0.4$, $0 \le c \le 0.4$, $0.05 \le d \le 0.3$, $0.05 \le e \le 0.4$, and $a+b+c+d+e=1$, and the acid labile group of $R^2$ is one or more group selected from groups having the following formulae (a-1) to (a-3):

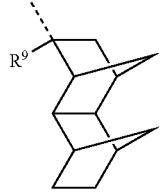

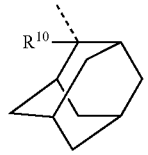

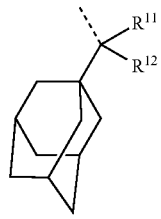

wherein the broken line denotes a valence bond, and $R^9$, $R^{10}$, $R^{11}$, and $R^{12}$ are each independently a straight or branched alkyl group of 1 to 4 carbon atoms, and said compound (B) is a sulfonium salt compound selected from the group consisting of those represented by the following formulae:

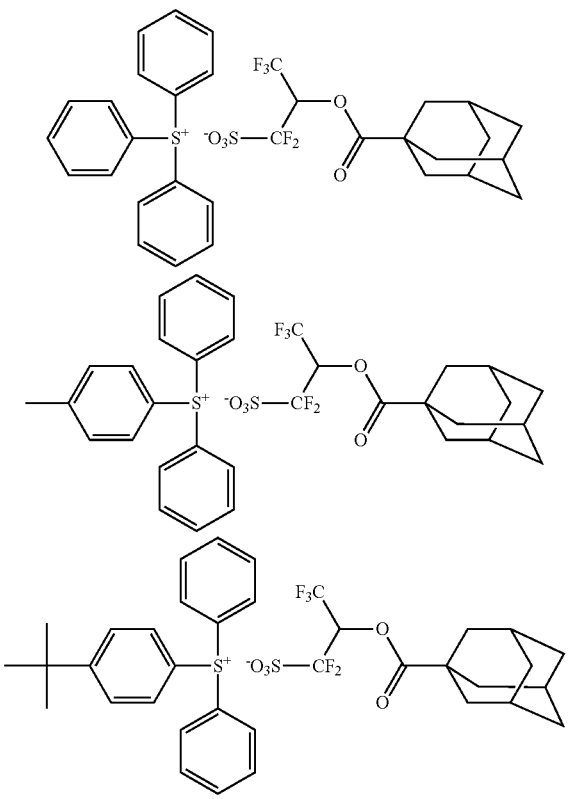

-continued

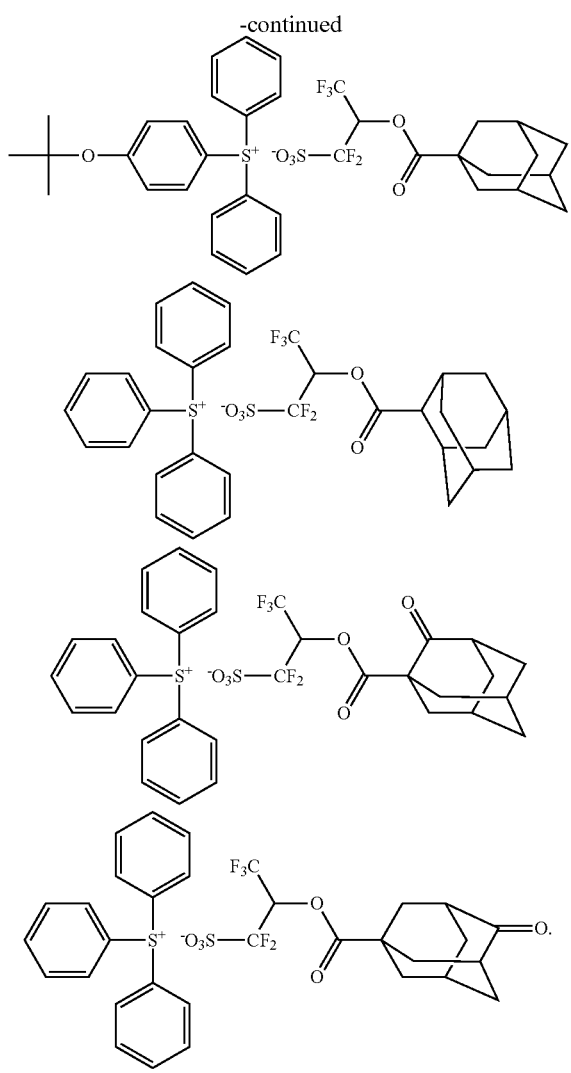

2. A process for forming a pattern, comprising the steps of applying the positive resist composition of claim 1 onto a substrate to form a resist coating, baking, exposing the resist coating to high-energy radiation or electron beam through a mask, PEB, and developing the exposed coating with a developer.

3. A process for forming a pattern, comprising the steps of applying the positive resist composition of claim 1 onto a substrate to form a resist coating, baking, exposing the resist coating to high-energy radiation or electron beam through a mask, PEB, and developing the exposed coating with a developer, the exposing step being effected by immersion lithography wherein a fluid comprising deionized water or an organic compound intervenes between the resist coating and a projection lens.

4. A process for forming a pattern, comprising the steps of applying the positive resist composition of claim 1 onto a substrate to form a resist coating, baking, exposing the resist coating to high-energy radiation or electron beam through a mask, PEB, and developing the exposed coating with a developer, said process further comprising the step of applying a protective coating on the resist coating, the exposing step being effected by immersion lithography wherein a fluid comprising deionized water or an organic compound intervenes between the protective coating and a projection lens.

* * * * *